(12) United States Patent
Hunter et al.

(10) Patent No.: US 10,784,849 B1
(45) Date of Patent: Sep. 22, 2020

(54) ENERGY STORAGE ELEMENT CONTROL CIRCUIT

(71) Applicant: TEXAS INSTRUMENTS INCORPORATED, Dallas, TX (US)

(72) Inventors: Bradford Lawrence Hunter, Spicewood, TX (US); Kenneth J. Maggio, Dallas, TX (US); Christopher Lee Betty, Arlington, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/555,563

(22) Filed: Aug. 29, 2019

Related U.S. Application Data

(60) Provisional application No. 62/812,296, filed on Mar. 1, 2019.

(51) Int. Cl.
*H03K 17/0412* (2006.01)
*H03K 17/16* (2006.01)

(52) U.S. Cl.
CPC ..... *H03K 17/04123* (2013.01); *H03K 17/166* (2013.01)

(58) Field of Classification Search
CPC .............. H03K 17/04123; H03K 17/166
USPC .................. 327/108, 109, 110, 111, 112
See application file for complete search history.

(56) References Cited

U.S. PATENT DOCUMENTS

| | | | |
|---|---|---|---|
| 4,471,245 A | 9/1984 | Janutka | |
| 4,877,982 A | 10/1989 | Walker | |
| 8,310,284 B2 * | 11/2012 | Heck | H03K 17/063 327/108 |
| 2014/0266392 A1 | 9/2014 | Devarajan et al. | |
| 2016/0182040 A1 | 6/2016 | Huang et al. | |
| 2017/0317583 A1 | 11/2017 | Forghani-Zadeh et al. | |

* cited by examiner

*Primary Examiner* — John W Poos
(74) *Attorney, Agent, or Firm* — Lawrence J. Bassuk; Charles A. Brill; Frank D. Cimino

(57) ABSTRACT

An energy storage element control circuit includes a charge transistor having a first node adapted to be coupled to an output node of the energy storage element control circuit and a second node adapted to be coupled to a terminal of an energy storage element. The energy storage control circuit also includes a boot capacitor having a first node and a second node. The energy storage element further includes a comparator that includes a first input node coupled to the first node of the charge transistor and a second input node adapted to be coupled to the terminal of the energy storage element. The comparator also includes an output node.

18 Claims, 8 Drawing Sheets

US 10,784,849 B1

ENERGY STORAGE ELEMENT CONTROL CIRCUIT

CROSS-REFERENCE TO RELATED APPLICATION

This application claims the benefit of priority to U.S. Provisional Application No. 62/812,296, filed on 1 Mar. 2019, the entirety of which is herein incorporated by reference.

TECHNICAL FIELD

This relates generally to electronic circuitry, and more particularly to a circuit for an energy storage element control circuit.

BACKGROUND

A voltage regulator is a system designed to automatically maintain a relatively constant voltage level. A voltage regulator may use a simple feed-forward design or may include negative feedback. A voltage regulator may be used to regulate one or more alternating current (AC) or direct current (DC) voltages. Voltage regulators are found in devices such as computer power supplies where the voltage regulators stabilize the DC voltages used by the processor and other elements.

In electrical engineering, a metal oxide semiconductor field effect transistor (MOSFET) has a turn-on delay that is impacted by a gate capacitance of the MOSFET. More particularly, the turn-on delay for each MOSFET is based in part on the time taken to charge the gate capacitance of the MOSFET before drain current conduction can start.

SUMMARY

In a first example, an energy storage element control circuit includes a charge transistor having a first node adapted to be coupled to an output node of the energy storage element control circuit and a second node adapted to be coupled to a terminal of an energy storage element. The energy storage control circuit also includes a boot capacitor having a first node and a second node. The energy storage element further includes a comparator that includes a first input node coupled to the first node of the charge transistor and a second input node adapted to be coupled to the terminal of the energy storage element. The comparator also includes an output node.

In a second example, an energy storage element control circuit includes a charge transistor configured to control a flow of current to an energy storage element terminal based on a voltage difference between an energy storage element voltage at the energy storage element terminal, which is adapted to be coupled to a first node of the charge transistor, and a control node of the charge transistor. The energy storage element control circuit also includes a turn-on integrated circuit (IC) chip. The turn on IC chip includes a comparator configured to output a comparator output signal in response to the energy storage element voltage at the energy storage element terminal exceeding a voltage at an output node of the energy storage element control circuit by at least a threshold voltage level. The turn-on IC chip is configured to assert a boot signal based at least in part on the comparator output signal. The boot signal is to apply a voltage to a boot capacitor that drives the control node of the charge transistor to a turn-on level that is greater than the energy storage element voltage.

In a third example, an energy storage element system includes an energy storage element. The energy storage element system also includes an energy storage element control circuit adapted to be coupled between a terminal of the energy storage element and an output node of the energy storage element control circuit. The energy storage element control circuit includes a charge transistor configured to control a flow of current to the terminal of the energy storage element based on a voltage difference between a voltage at the terminal of the energy storage element and the output node of the energy storage element control circuit. The energy storage control circuit also includes a boot capacitor and a turn-on integrated circuit (IC). The turn-on IC chip is configured to provide a voltage to the boot capacitor to raise a voltage at a control node of the charge transistor in response to the voltage at the terminal of the energy storage element exceeding a voltage at the output node of the energy storage element control circuit by at least a threshold voltage level, such that the control node of the charge transistor increases to a turn-on level that is greater than the voltage of the terminal of the energy storage element. The energy storage element system still further includes a circuit that includes a power supply that is adapted to be coupled to the output node of the energy storage element control circuit and a processor that is powered by the power supply and the energy storage element.

DETAILED DESCRIPTION

This disclosure relates to an energy storage element (ESE) control circuit situated between an ESE (e.g., a battery or supercapacitor) and an external circuit that may include a power supply to charge the ESE and/or a power sink. The ESE control circuit includes a charge transistor configured to control the flow of current between the ESE and the external circuit. The ESE control circuit includes a turn-on integrated circuit (IC) chip configured to facilitate a fast turn-on (e.g., 20 microseconds (μs) or less) of the charge transistor thus avoiding a slow turn-on time (e.g., greater than 20 μs) of the charge transistor. In some examples, the ESE control circuit resides on a system implementing a mobile computing device, such as a smart phone, a laptop or a tablet computer or any other device powered by a single cell or a multi-cell rechargeable battery pack, wherein such a single cell or a multi-cell rechargeable battery pack includes the ESE (e.g., implemented as a battery) as one or more cells in the single cell or multi-cell rechargeable battery pack.

In operation, the ESE control circuit is configured to monitor an ESE voltage (e.g., an input voltage) and an output voltage of the ESE control circuit that is applied to the external circuit. If the ESE voltage exceeds the output voltage by less than a threshold voltage (indicating that the ESE is fully charged), the turn-on IC chip turns the charge transistor off, thereby preventing additional current from flowing to the ESE. Additionally, in situations where the ESE voltage exceeds the output voltage by at least the threshold voltage, such where a component (e.g., a loudspeaker or amplifier) on the external circuit needs additional power (e.g., in a transient state), the turn-on IC chip applies a voltage to a node of a boot capacitor coupled to a control node of the charge transistor. The applied voltage quickly (e.g., within 20 µs) turns on the charge transistor to enable current to flow from the ESE to the external circuit through the charge transistor. By employing the ESE control circuit, slow turn-on times (e.g., greater than 20 µs) of the charge transistor are avoided.

Figure 1:
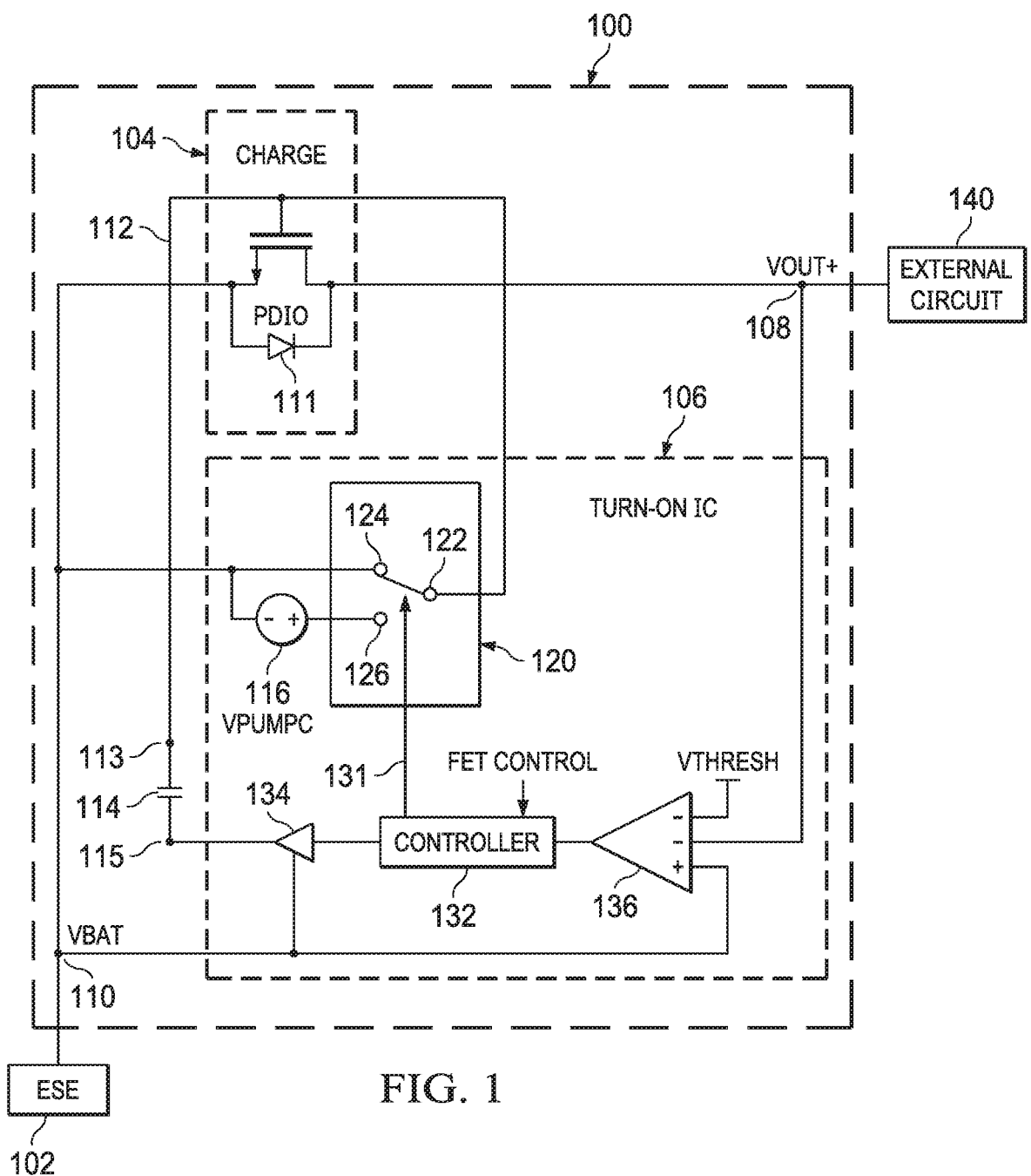
FIG. 1 is a diagram of an example of an energy storage element (ESE) control circuit.

FIG. 1 is a block diagram of an ESE control circuit 100 configured to charge an ESE 102 that avoids the aforementioned slow turn-on time (e.g., greater than 20 µs) of a charge transistor 104. In some examples, the ESE 102 is implemented as a battery. In other examples, the ESE 102 is implemented as a supercapacitor. In some examples, the ESE control circuit 100 is implemented in a battery charger or protector, including a device that employs a rechargeable single cell or multi-cell battery pack. The ESE control circuit 100 includes a turn-on integrated circuit (IC) chip 106 configured to enable fast turn-on time (e.g., within 20 µs) of the charge transistor 104.

The charge transistor 104 is illustrated and described as being an enhancement mode n-channel metal oxide semiconductor (NMOS) field effect transistor. However, in other examples, other types of transistors, such as Group III-V transistor (e.g., a gallium nitride (GaN) transistor), an isolated gate bipolar transistor (IGBT), a bipolar junction transistor (BJT) and silicon carbide (SiC) transistor. The charge transistor 104 includes a first node (e.g., a drain) that is coupled to an output node 108 of the ESE control circuit 100. Additionally, the charge transistor 104 includes a second node (e.g., a source) that is coupled to an ESE terminal 110 (e.g., a positive terminal of the ESE 102, or VBAT where the ESE 102 includes a battery cell). The charge transistor 104 (implemented as an NMOS) has a body diode 111 that connects the first node and the second node of the charge transistor. The body diode has a voltage drop of 0.3 volts (V) to 1.0 V.

The term "couple" is used throughout the specification. The term may cover connections, communications, or signal paths that enable a functional relationship consistent with the description of this disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A through the control signal generated by device A.

A control node 112 (e.g., a gate) of the charge transistor 104 is coupled to a first node 113 of a boot capacitor 114. The boot capacitor 114 has a second node 115 coupled to an output of the turn-on IC chip 106. In some examples where the charge transistor 104 is implemented as an NMOS, the boot capacitor 114 has a capacitance greater than a gate capacitance of the charge transistor 104. As one example, if the gate capacitance of the charge transistor is 4 nanofarads (nF), the boot capacitor 114 may be selected to have a capacitance of 100 nF. Additionally, a switch 120 is connected between the control node 112 and the ESE terminal 110. The switch 120 includes a common node 122 and a first terminal 124 and a second terminal 126 and the switch 120 is configured to couple the first terminal 124 or the second terminal 126 with the common node 122 in response to a control signal. In some examples, the switch 120 is implemented as a single pole change switch, which can alternatively be referred to as a two state switch. The first terminal 124 of the switch 120 is coupled to the ESE terminal 110 and the second terminal 126 of the switch is coupled to a positive node of the charge pump 116. The charge pump 116 is configured to provide a charge pump voltage, VPUMPC to the ESE voltage at the ESE terminal 110 of the ESE 102. The control node 112 of the charge transistor 104 is coupled to the common node 122 of the switch 120. In this way, the control node 112 (e.g., a gate) is switchably connected to the ESE terminal 110 of the ESE 102 and to a charge pump 116, which is also connected to the ESE terminal 110. As used herein, the term switchably connected refers to an intermittent connection between such a node and a terminal based on a state of a switch.

In FIG. 1, components of the ESE control circuit 100, such as the turn-on IC chip 106, the charge transistor 104 and the boot capacitor 114 are illustrated and described as being discrete components. However, in other examples, components of the ESE control circuit 100 could be integrated on a single IC chip.

As an example, the charge pump 116 is a direct current (DC)-DC converter that includes capacitors to raise the voltage at the ESE terminal 110 to the charge pump voltage, VPUMPC that is selectively applied through the switch 120 to the control node 112 (e.g., a gate) of the charge transistor 104. In some examples, the charge pump voltage, VPUMPC at the second terminal 126 of the switch 120 is about (e.g., within ±10%) twice of the voltage at the ESE terminal 110, VBAT.

The switch 120 has a first state and a second state. In the first state (as illustrated), the first terminal 124 is coupled to the control node 112 of the charge transistor 104. In the second state, the second terminal 126 is coupled to the control node of the charge transistor 104. The state of the switch 120 is controlled by a switch control signal 131 provided by a controller 132 of the turn-on IC chip 106. In some examples, the controller 132 is implemented as a digital controller embedded in the turn-on IC chip 106. In other examples, the controller 132 is implemented as a gate array configured to execute a specific set of operations.

The controller 132 is configured to provide a boot signal at a boot output node to charge the boot capacitor 114. For example, a buffer 134 is coupled between an output of the controller 132 and the second node 115 of the boot capacitor 114, and the boot signal is provided to an input of the buffer 134. Additionally, a positive voltage rail of the buffer 134 is coupled to the ESE terminal 110 of the ESE 102 and a negative terminal (not shown) is coupled to an electrically neutral node (e.g., ground). The controller 132 and the buffer 134 are configured such that assertion of the boot signal (e.g., a logical 1), is configured to cause the output of the buffer 134 at the second node 115 of the boot capacitor 114 drive to a voltage level about equal (e.g., within ±10%) of the voltage at the ESE terminal 110, VBAT according to the positive rail voltage of the buffer 134. Conversely, in situations where the boot signal is de-asserted (e.g., a logical 0), the output of the buffer 134 provided to the second node 115 of the boot capacitor 114 is driven to a voltage of the electrically neutral node (e.g., 0 V or ground) according to a negative rail voltage of the buffer 134.

The turn-on IC chip 106 also includes a comparator 136. In this example, the comparator 136 includes three inputs. More particularly, the ESE terminal 110 is coupled to a non-inverting input of the comparator 136. Additionally, the output node 108 of the ESE control circuit 100 is coupled to a first inverting input of the comparator 136. Furthermore, a threshold voltage, VTHRESH is coupled to a second inverting input of the comparator 136. As an example, the threshold voltage, VTHRESH is set to a value in a range of 10-50 millivolts (mV). An output of the comparator 136 is coupled to an input of the controller 132 to provide a comparator output signal to the input of the controller.

The comparator 136 is configured to assert (e.g., a logical 1) the voltage threshold signal in response to the voltage at the ESE terminal 110, VBAT exceeding the voltage at the output node 108, VOUT+ by more than the threshold voltage, VTHRESH. Conversely, in response to the comparator detecting that the voltage at the ESE terminal 110, VBAT does not exceed the voltage at the output node 108, VOUT+ by more than the threshold voltage, VTHRESH, the comparator 136 is configured to de-assert (e.g., a logical 0) the comparator output signal.

The output node 108 of the ESE control circuit 100 is coupled to an external circuit 140. In some examples, the external circuit 140 is implemented within an external system, such as a computing device (e.g., a mobile computing device) that is powered by the ESE 102. The external circuit 140 may include a power supply configured to provide a DC signal at the output node 108 of the ESE control circuit 100. Additionally or alternatively, Additionally, in some situations, as explained herein, the ESE 102 provides a DC signal to the external circuit 140. Accordingly, in the present example, power flow is bi-directional, such that current flows from the external circuit 140 to the ESE control circuit 100 and to the ESE 102 or from the ESE 102, through the ESE control circuit 100 to the external circuit 140 depending on the state of the ESE 102 and/or the state of the external circuit 140. The ESE control circuit 100 controls the flow of current provided from the ESE 102 and the input of current provided to the ESE 102 from the external circuit 140.

In some examples, the controller 132 receives a field effect transistor (FET) control signal, FET CONTROL configured to set a state of the ESE control circuit 100. In some examples, the FET control signal, FET CONTROL is provided to an input terminal of the turn-on IC chip 106 from an external source (e.g., another controller). Further, in other examples, the controller 132 includes internal logic configured to derive the FET control signal, FET CONTROL. The FET control signal, FET CONTROL provides a command for turning off the charge transistor 104, which correlates to a command for not charging the ESE 102. Alternatively, the FET control signal, FET CONTROL provides a command for turning on the charge transistor 104, which correlates to a command for charging the ESE 102. In a situation where the FET control signal, FET CONTROL indicates that the charge transistor 104 is to be turned off, and the comparator output signal provided from the comparator 136 is a logical 0, the controller 132 is configured to cause the switch 120 to remain in the first state and the charge transistor 104 is turned off (e.g., operates in a cut-off region).

In situations where the FET control signal, FET CONTROL indicates that the charge transistor 104 is permitted to be turned on or the comparator output signal provided from the comparator 136 is a logical 1, the ESE control circuit 100 is configured to control the flow of current to the ESE 102. More particularly, in a situation where the charge transistor 104 is turned on (e.g., operates in a linear region), current flows from the power supply of the external circuit 140 through the output node 108, through the charge transistor 104, to the ESE terminal 110 and to the ESE 102. Alternatively, current flows from the ESE 102, through the charge transistor 104, to the output node 108 and to a component of the external circuit 140.

In the examples described, the comparator output signal provided by the comparator 136 and the FET control signal, FET CONTROL are evaluated by the controller 132 with an OR gate relationship. In other examples, the FET control signal, FET CONTROL is an override signal, and the controller 132 controls the state of the switch 120 based on the state of the FET control signal, FET CONTROL.

The ESE control circuit 100 is configured such that in situations where the voltage at the ESE terminal 110, VBAT minus the voltage at the output node 108, VOUT+ is less than the threshold voltage, VTHRESH (e.g., VBAT−VOUT+<VTHRESH), the comparator 136 de-asserts the comparator output signal (e.g., logical 0) that is provided to the controller 132. Conversely, in situations where the voltage at the ESE terminal 110, VBAT exceeds the voltage at the output node 108, VOUT+ by voltage greater than or equal to the threshold voltage, VTHRESH (e.g., VBAT−VOUT+≥VTHRESH), the comparator 136 asserts the comparator output signal (e.g., logical 1).

Figure 2:
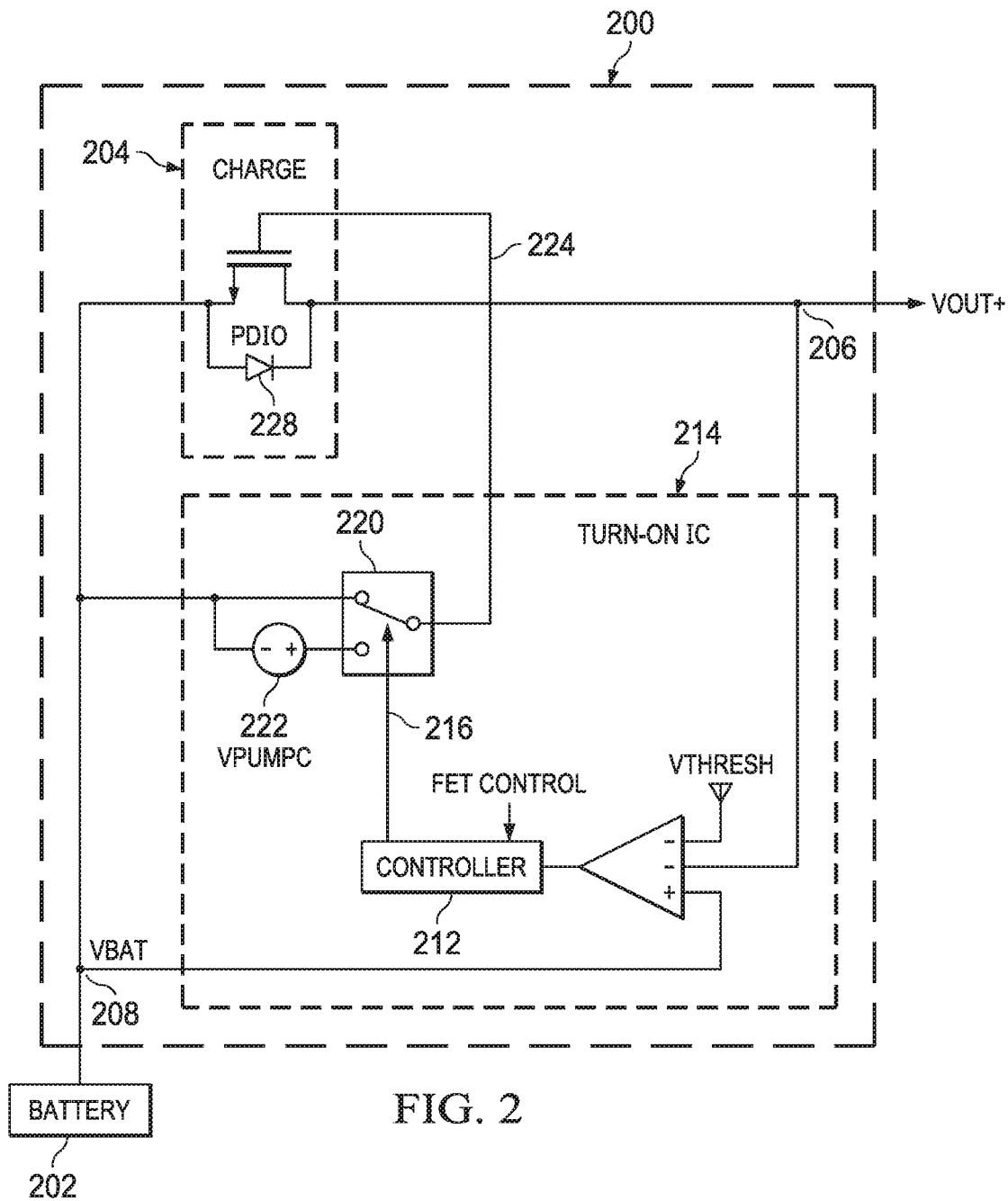
FIG. 2 is a diagram of an example of a battery control circuit.

FIG. 2 is a block diagram of a battery control circuit 200 configured to charge a battery 202 that has a slow turn-on time (e.g., greater than 20 μs) of a charge transistor 204. In particular, the battery control circuit 200 omits the boot capacitor 114 of FIG. 1 (and associated components). In situations where a voltage at an output node 206 of the battery control circuit 200 drops below a voltage at a battery terminal 208 of a battery 202, VBAT, by more than a threshold voltage, VTHRESH, a controller 212 of a turn-on IC chip 214 is configured to turn on the charge transistor 204.

To turn on the charge transistor 204, the controller provides a control signal 216 to a switch 220 that is configured to cause the switch 220 to couple a charge pump 222 to a control node 224 of the charge transistor 204. However, due to a relatively long rise time of the charge pump 222 (e.g., 100 μs or more) implemented on the turn-on IC chip 214, a body diode 228 conducts an output current, prior to the charge transistor 204 turning on. Accordingly, the voltage, VOUT+ at the output node 206 is reduced relative to the voltage at the battery terminal 208, VBAT by a voltage drop of the voltage drop across the body diode 228, PDIO until the charge pump 222 reaches a turn-on voltage of the charge transistor 204, CHARGE FET VON. At that point, the charge transistor 204 turns-on, reducing a voltage drop across the charge transistor 204 to an on drain-to-source voltage, VDS (ON) for the charge transistor 204. Thus, the slow turn-on time of the charge transistor 204 (e.g., greater than 20 μs due to the slow rise time of charge pump 222) presents problems that need to be addressed.

Returning to FIG. 1, in situations where the comparator output signal from the comparator 136 is de-asserted (e.g., logical 0), and the FET control signal, FET CONTROL indicates that the charge transistor 104 is to be turned-off, the controller 132 de-asserts the boot signal provided to the buffer 134, such that the second node 115 of the boot capacitor 114 is near (e.g., within ±10%) of 0 V. Additionally, the switch control signal 131 provided from the controller 132 to the switch 120 causes the switch 120 to remain in the first state. In this situation, the control node 112 and the second node (e.g., the source) of the charge transistor 104 are both coupled to the ESE terminal 110. Accordingly, the charge transistor 104 (e.g., an NMOS) has a gate-to-source voltage, VGS of 0 V, and the charge transistor 104 is turned off. Additionally, in this state, because the first node 113 of the boot capacitor 114 is coupled to the ESE terminal 110 through the control node 112, the boot capacitor 114 is charged to the same voltage level as voltage level of the ESE terminal 110, VBAT over time.

As noted, in response to detecting that the voltage at the output node 108, VOUT+ drops below the voltage at the ESE terminal 110, VBAT by at least the threshold voltage, VTHRESH, the comparator 136 asserts the comparator output signal (e.g., logical 1). The voltage at the output node 108, VOUT+ may drop, for example, in situations where a component (e.g., a loudspeaker or an amplifier) on the external circuit 140 needs transient power. Alternatively, voltage at the output node 108, VOUT+ may drop if the power supply of the external circuit 140 is disconnected from an external power source (e.g., a power outlet). In response to assertion of the comparator output signal or in response to the FET control signal, FET CONTROL indicating that the charge transistor 104 is to be turned on, the controller 132 is configured to assert the boot signal (e.g., logical 1) that is provided to the buffer 134. Assertion of the boot signal causes the buffer 134 to output a voltage nearly equal (e.g., within ±10%) to the voltage at the ESE terminal 110, VBAT to the voltage at the second node 115 of the boot capacitor 114. Applying the voltage of the ESE terminal 110, VBAT to the second node 115 of the boot capacitor 114 to the voltage operates as an offset voltage that raises voltage at the first node 113 of the boot capacitor 114 to a level that is near (e.g., within ±10%) two times the voltage at the ESE terminal 110 VBAT, namely, 2*VBAT. Accordingly, the first node 113 of the boot capacitor 114 provides a voltage to the control node 112 of the charge transistor 104 that is at least the turn-on level for the charge transistor 104, CHG FET VON. In situations where the charge transistor 104 is an NMOS, because the control node 112 is coupled to the first node 113 of the boot capacitor 114, the gate-to-source voltage, VGS of the charge transistor 104 is raised from 0 V to about (e.g., within ±10%) the voltage at the ESE terminal 110, VBAT, thereby turning on the charge transistor 104 (causing the charge transistor 104 to operate in the linear region) within 20 μs.

Additionally, at nearly the same time (e.g., within 10 nanoseconds) of asserting the boot signal, in further response to the assertion of the comparator output signal by the comparator 136, the controller 132 is configured to cause the switch 120 to switch to the second state, which couples the charge pump 116 to the control node 112 of the charge transistor 104. However, because the charge transistor 104 is already turned on, a rise time of the charge pump 116 does not impact the turn-on time of the charge transistor 104. Rather, the charge pump 116 is configured to hold the control node 112 at the voltage level of about 2*VBAT as long as the switch 120 remains in the second state. That is, the inclusion of the boot capacitor 114 avoids the slow turn-in time (e.g., greater than 20 μs) of the charge transistor 204 of FIG. 2.

Figure 3:
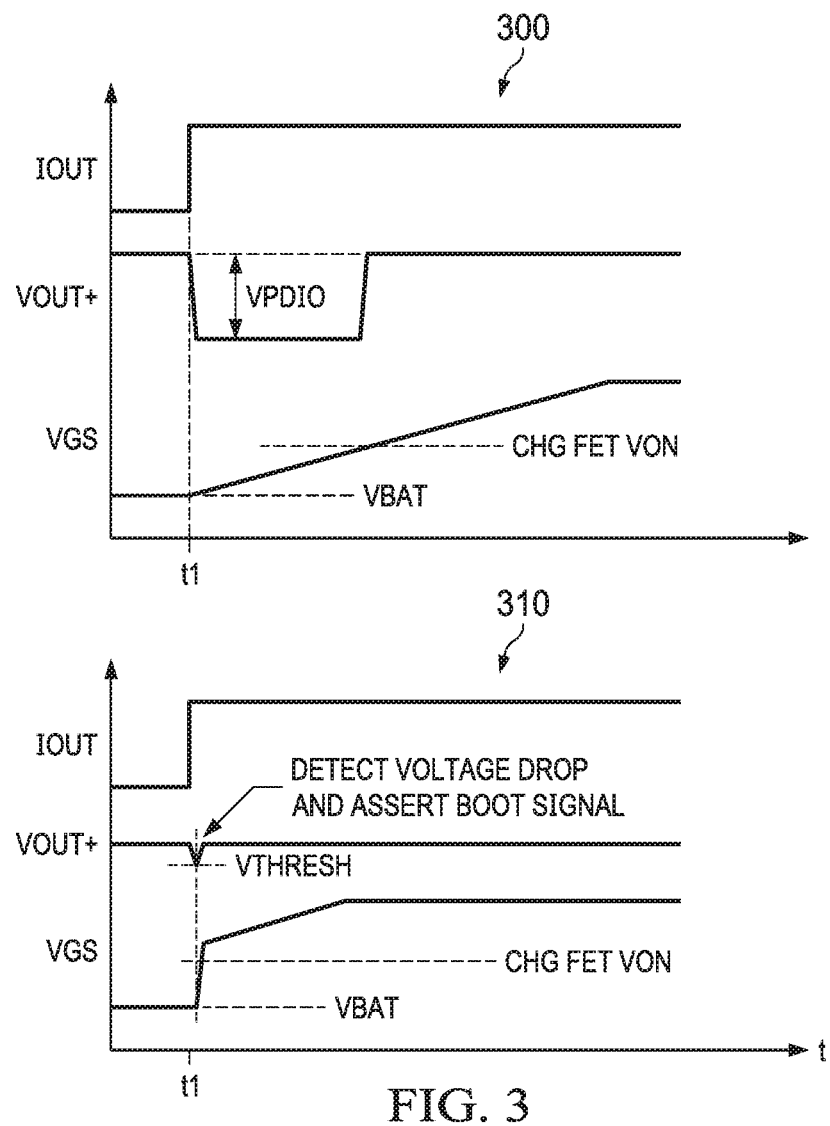
FIG. 3 is a graph that plots voltage and current signals as a function of time.

FIG. 3 illustrates timing diagrams 300 and 310 that each plot signals as a function of time, and wherein the timing diagrams 300 and 310 represent the same timeframe. The timing diagram 300 represents a timing diagram for the battery control circuit 200 of FIG. 2 and the timing diagram 310 represents a timing diagram for the ESE control circuit 100 of FIG. 1.

In the timing diagram 300, at time, t1, an output current, IOUT is a current output at the output node 206 in FIG. 2, rises from a level near 0 amperes (A) to a maximum level (e.g., a linear or saturation current) in response to a voltage drop of an output voltage, VOUT+(e.g., the voltage at the output node 206 of FIG. 2) from an initial level to a second level that is equivalent to the diode drop voltage of the body diode 228 of the charge transistor 204 of FIG. 2. Additionally, in the timing diagram 300, a gate-to-source voltage, VGS of the charge transistor 204 of FIG. 2 ramps up from a voltage at the battery terminal 208, VBAT to the turn-on level for the charge FET, CHG FET VON over time, as caused by a rise in voltage at the charge pump 222 of FIG. 2. In response to the gate-to-source voltage, VGS reaching the turn-on level for the charge FET, CHG FET VON, the output voltage, VOUT+ is restored to the initial level.

In the timing diagram 310, an output current, IOUT, which is the current at the output node 108 in FIG. 1, rises from a level near 0 amperes (A) to a maximum level (e.g., a linear or saturation current) in response to a voltage drop of an output voltage, VOUT+ by a threshold voltage. At time t1, the drop in the output voltage, VOUT+ by the threshold voltage, VTHRESH is detected by the comparator 136 of FIG. 1, and the comparator output signal from the comparator 136 is asserted. In response, the controller 132 asserts the boot signal, which is configured to cause the second node 115 of the boot capacitor 114 of FIG. 1 to be raised to a level near the voltage at the ESE terminal 110, VBAT. In response, the control node (e.g., the gate) of the charge transistor 104 is raised to a level near (e.g., within ±10%) of twice the ESE voltage, 2*VBAT, causing the charge transistor 104 of FIG. 1 to turn on. Additionally, the controller 132 is configured to cause the switch 120 to switch to the second state, coupling the charge pump 116 of FIG. 1 to the control node 112 of the charge transistor 104. As is illustrated, a gate-to-source voltage, VGS is raised above the charge FET turn-on voltage, CHG FET VON of the charge transistor 104, such that the charge transistor of FIG. 1 turns on.

Referring back to FIG. 1, as demonstrated in by the timing diagrams 300 and 310 of FIG. 3, inclusion of the boot capacitor 114 in the ESE control circuit 100 avoids the slow turn-on time (e.g., more than 20 μs) for the charge transistor 104. Rather, the ESE control circuit 100 is configured to turn on the charge transistor 104 in 20 μs or less such that the voltage at the output node 108, VOUT+ does not drop by more than the threshold voltage, VTHRESH relative to the voltage at the ESE terminal 110, VBAT.

Figure 4:
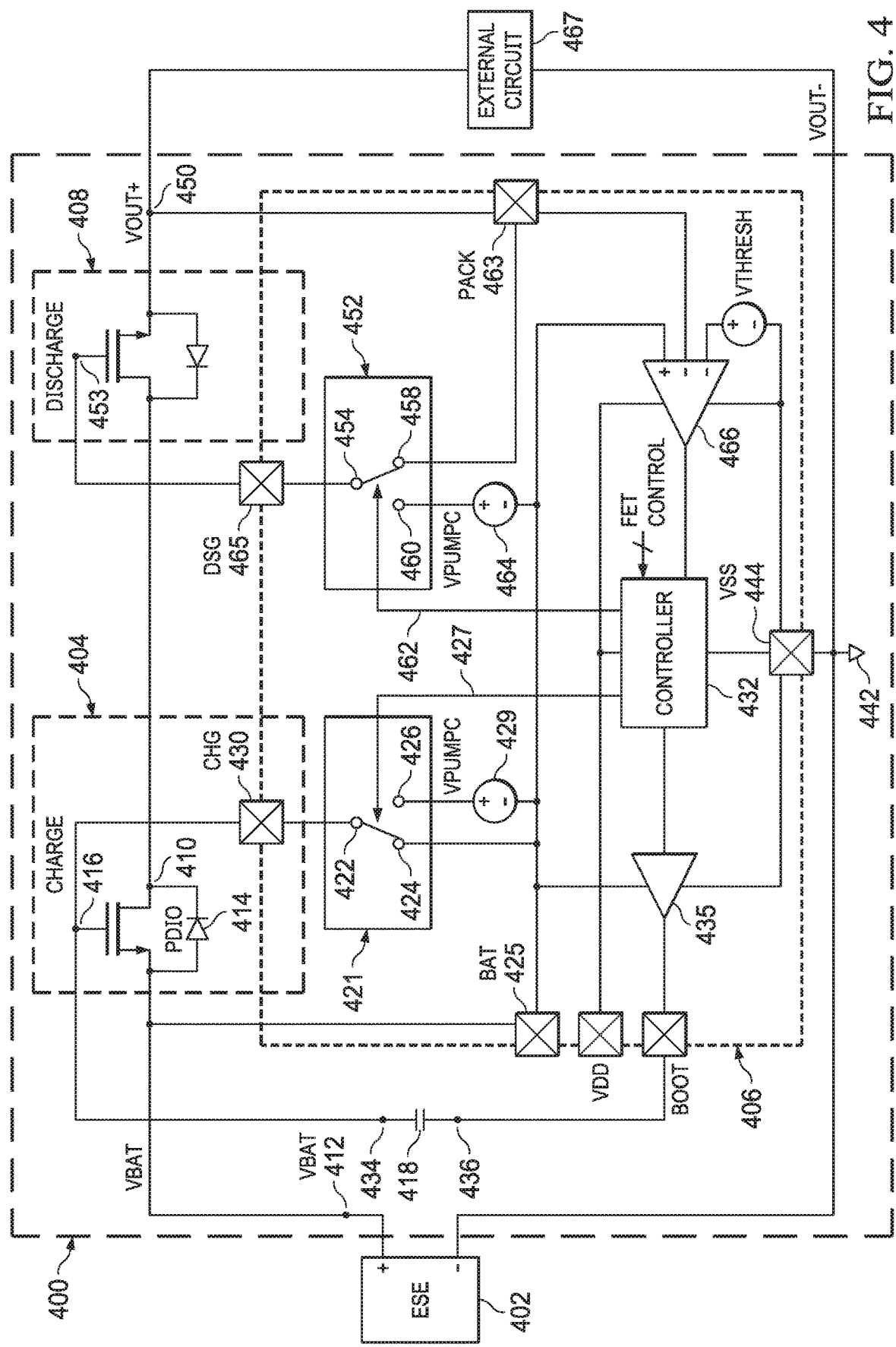
FIG. 4 illustrates a circuit diagram of an example of an ESE control circuit.

FIG. 4 is a circuit diagram of an example ESE control circuit 400 for controlling charging and discharging of an ESE 402 that avoids the aforementioned slow turn-on time (e.g., greater than 20 μs) of a charge transistor 404, CHARGE. In some examples, the ESE 402 is implemented as a battery. In other examples, the ESE 402 is implemented as a supercapacitor. The ESE control circuit 400 is employable to implement the ESE control circuit 100 of FIG. 1. In some examples, the ESE control circuit 400 is implemented in a battery charger or protector. The ESE control circuit 400 includes a turn-on IC chip 406 that facilitates a fast turn-on time (e.g., 20 us or less) of the charge transistor 404.

The ESE control circuit 400 also includes a discharge transistor 408, DISCHARGE. The turn-on IC chip 406 also controls a state of the discharge transistor 408. By controlling a state (e.g., on or off) of the charge transistor 404 and the discharge transistor 408, the ESE control circuit 400 is configured to control a flow of current to and from the ESE 402.

The charge transistor 404 and the discharge transistor 408 are illustrated and described as being NMOSs. However, in other examples, other types of transistors are employable as the charge transistor 404 and/or the discharge transistor 408. The charge transistor 404 includes a first node (e.g., a drain) that is coupled to a first node 410 (e.g., a drain) of the discharge transistor 408. Additionally, the charge transistor 404 includes a second node (e.g., a source) that is coupled to an ESE terminal 412 of the ESE 402. The ESE terminal 412 is implemented as a positive terminal of the ESE 402, or VBAT where the ESE 402 includes a battery cell. The charge transistor 404 (implemented as an NMOS) has a body diode 414 that couples the first node 410 (e.g., the drain) and the second node (e.g., the source) of the charge transistor 404, coupled to the ESE terminal 412. The body diode 414 has a diode drop voltage of PDIO (e.g., 0.3 V to 1.0 V).

A control node 416 (e.g., a gate) of the charge transistor 404 is coupled to a boot capacitor 418. Additionally, a charge state switch 421 is connected between the control node 416 and the ESE terminal 412. The charge state switch 421 includes a common node 422, a first terminal 424 and a second terminal 426 and the charge state switch 421 is configured to couple the first terminal 424 or the second terminal 426 with the common node 422 in response to a charging state control signal 427. In some examples, the charge state switch 421 is implemented as a single pole change switch, which can alternatively be referred to as a two state switch. The first terminal 424 of the charge state switch 421 is coupled to the ESE terminal 412 through an ESE connection terminal 425, BAT and the second terminal 426 of the charge state switch 421 is coupled to a positive node of a charge transistor charge pump 429. The charge transistor charge pump 429 is configured to provide a charge pump voltage, VPUMPC to the ESE voltage at the ESE terminal 412 of the ESE 402, VBAT. The control node 416 of the charge transistor 404 is coupled to the common node 422 of a charge state switch 421 through a charging terminal 430, CHG of the turn-on IC chip 406. In this way, the control node 416 (e.g., a gate) is switchably connected to the ESE terminal 412 of the ESE 402 and to the charge transistor charge pump 429, which is also connected to the ESE terminal 412.

A negative node of the charge transistor charge pump 429 is coupled to the ESE terminal 412 of the ESE 402 through the ESE connection terminal 425, BAT. The charge transistor charge pump 429 operates as a DC-DC converter that employs capacitors to raise a voltage from a voltage at the ESE terminal 412 to a charge transistor charge pump 429 voltage, VPUMPC for the charge transistor 404 that is selectively applied through the discharge state switch 452 to the control node 453 (e.g., a gate) of the discharge transistor 408. In some examples, the charge transistor charge pump voltage, VPUMPC is up to about (e.g., within ±10%) twice of a voltage at the ESE terminal 412, VBAT.

The charge state switch 421 has a first state and a second state. In the first state (as illustrated), the first terminal 424 is coupled to the control node 416 of the charge transistor 404 through the common node 422 of the charge state switch 421. In the second state, the second terminal 426 is coupled to the control node 416 of the charge transistor 404 through the common node 422 of the charge state switch 421. The state of the charge state switch 421 is controlled by the charging state control signal 427 provided by a controller 432 of the turn-on IC chip 406. In some examples, the controller 432 is implemented as a digital controller embedded in the turn-on IC chip 406. In other examples, the controller 432 is implemented as a gate array configured to execute a specific set of operations.

The first node 434 of the boot capacitor 418 is coupled to the control node 416 of the charge transistor 404. Additionally, the controller 432 is configured to provide a boot signal to charge the boot capacitor 418. For example, a buffer 435 is coupled between an output of the controller 432 and a second node 436 of the boot capacitor 418, and the boot signal is provided to an input of the buffer 560. More particularly, the boot capacitor 418 includes a first node 434 and a second node 436. The second node of the boot capacitor 418 is coupled to an output node of a buffer 435. Additionally, a positive voltage rail of the buffer 435 is coupled to the ESE terminal 412 of the ESE 402 and a negative voltage rail of the buffer 435 is coupled to an electrically neutral node 442, (e.g., ground) through a neutral terminal 444, VSS of the turn-on IC chip 406. The controller 432 and the buffer 435 are configured such that in response to assertion of the boot signal (e.g., a logical 1), the output of the buffer 435 at the second node 436 of the boot capacitor 418 is driven to a voltage level about equal (e.g., within ±10%) to the voltage at an ESE terminal 412, BAT of the turn-on IC chip 406 according to the positive rail voltage of the buffer 435. Conversely, in situations where the boot signal is de-asserted (e.g., a logical 0), the output of the buffer 435 at the second node 436 of the boot capacitor 418 is driven to a voltage of the electrically neutral node 442 (e.g., 0 volts (V) or ground) according to a negative voltage rail of the buffer 435.

A second node (e.g. a source) 450 of the discharge transistor 408 provides an output voltage, VOUT+ of the ESE control circuit 400. Additionally, a discharge state switch 452 is connected between a control node 453 (e.g., a gate) of the discharge transistor 408 and the ESE terminal 412. The discharge state switch 452 includes a common node 454, a first terminal 458 and a second terminal 460 and the discharge state switch 452 is configured to couple the first terminal 458 or the second terminal 460 with the common node 454 in response to a discharge control signal 462. In some examples, the discharge state switch 452 is implemented as a single pole change switch, which can alternatively be referred to as a two state switch. The first terminal 458 of the discharge state switch 452 is coupled to the output node 450 of the ESE control circuit 400 through a pack terminal 463, PACK and the second terminal 460 of the discharge state switch 452 is coupled to a positive node of a discharge transistor charge pump 464. The discharge transistor charge pump 464 is configured to provide a charge pump voltage, VPUMPD to the ESE voltage at the ESE terminal 412 of the ESE 402, VBAT. Additionally, the control node (e.g., a gate) 453 of the discharge transistor 408 is coupled to the common node 454 of the discharge state switch 452 through a discharging terminal 465, DSG of the turn-on IC chip 406. In this way, the control node 453 (e.g., a gate) of the discharge transistor 408 is switchably connected to the output node 450 of the ESE control circuit 400 and to the discharge transistor charge pump 464, which is coupled to the ESE terminal 412.

The discharge state switch 452 has a first state and a second state. In the first state (as illustrated), a first terminal 458 is coupled to the control node 453 (e.g., a gate) of the discharge transistor 408 through the common node 454 of the discharge state switch 452. In the second state, a second terminal 460 of the discharge state switch 452 is coupled to the control node 453 of the discharge transistor 408 through the common node 454 of the discharge state switch 452. The state of the discharge state switch 452 is controlled by the discharge control signal 462 provided by the controller 432 of the turn-on IC chip 406.

A negative node of a discharge transistor charge pump 464 is coupled to the ESE terminal 412 of the ESE 402. A positive node of the discharge transistor charge pump 464 is coupled to the second terminal 460 of the discharge state switch 452. The discharge transistor charge pump 464 operates as a DC-DC converter that includes capacitors to raise a voltage from a voltage at the ESE terminal 412 to a discharge transistor charge pump voltage, VPUMPD for the discharge transistor 408. In some examples, the discharge transistor charge pump voltage, VPUMPD is up to about (e.g., within ±10%) twice of a voltage at the ESE terminal 412, VBAT.

The turn-on IC chip 406 also includes a comparator 466. The comparator 466 may include three inputs. For example, the ESE terminal 412 is coupled to a non-inverting input of the comparator 466. Additionally, the output node 450 of the ESE control circuit 400 is coupled to an inverting input of the comparator 466 through the pack terminal 463, PACK of the turn-on IC chip. Furthermore, a threshold voltage, VTHRESH is coupled to another inverting input of the comparator 466. As an example, the threshold voltage, VTHRESH is set to a value in a range of 10-50 millivolts (mV). An output of the comparator 466 is coupled to an input of the controller 432, and the comparator provides a comparator output signal to the input of the controller.

The comparator 466 is configured to assert (e.g., a logical 1) the voltage threshold signal in response to the voltage at the ESE terminal 412, VBAT exceeding the voltage at the output node 450, VOUT+ by at least the threshold voltage, VTHRESH (e.g., VBAT−VOUT+≥VTHRESH). Conversely, in situations where the voltage at the ESE terminal 412, VBAT minus the voltage at the output node 450, VOUT+ is less than the threshold voltage, VTHRESH (e.g., VBAT−VOUT+<VTHRESH), the comparator 466 is configured to de-assert (e.g., a logical 0) the comparator output signal.

The output node 450 of the ESE control circuit 400 is coupled to an external circuit 467. The external circuit 467 may include a power supply configured to supply a DC signal to the output node 450 of the ESE control circuit 400 and/or a power sink. The external circuit 467 is also coupled to the electrically neutral node 442 (e.g., ground), which also provides a negative output voltage, VOUT−. Moreover, the electrically neutral node 442 is also coupled to a negative terminal of the ESE 402. In the example of FIG. 4, power flow is bi-directional, such that current flows from the external circuit 467 to the ESE control circuit 400 and to the ESE 402 or from the ESE 402, through the ESE control circuit 400 to the external circuit 467 depending on the state of the ESE 402 and/or the state of the external circuit 467.

In some examples, the controller 432 receives a FET control signal, FET CONTROL for setting a state of the ESE control circuit 400. In some examples, the FET control signal, FET CONTROL is a multi-bit signal, such as a two-bit signal. The FET control signal, FET CONTROL is provided to an input of the controller 432 from an external source (e.g., another controller). Further, in other examples, the controller 432 includes internal logic for deriving the FET control signal, FET CONTROL. The FET control signal, FET CONTROL provides a command to turn off the charge transistor 404, which correlates to a command for not charging the ESE 402. Alternatively, the FET control signal, FET CONTROL provides a command to turn-on the charge transistor 404, which correlates to a command for charging the ESE 402. Additionally, the FET control signal, FET CONTROL provides a command for turning off the discharge transistor 408, which correlates to a command for not discharging the ESE 402. Alternatively, the FET control signal, FET CONTROL provides a command to enable the discharge transistor 408 to be turned on, which correlates to a command for permitting discharging of the ESE 402.

In a situation where the FET control signal, FET CONTROL indicates that the charge transistor 404 is to be turned off and the comparator output signal by the comparator 566 is a logical 0, the controller 432 is configured to cause the charge state switch 421 to remain in the first state and the charge transistor 404 is turned off (e.g., operates in a cut-off region). Additionally, in a situation where the FET control signal, FET CONTROL indicates that the discharge transistor 408 is to be turned off, the controller 432 is configured to cause the discharge state switch 452 to remain the first state and the discharge transistor 408 is turned off (e.g., operates in a cut-off region). Additionally, in a situation where the FET control signal, FET CONTROL indicates that the discharge transistor 408 is permitted to be turned on, control of a state of the discharge transistor 408 is passed to the controller 432. In the examples illustrated, it is presumed that the FET control signal, FET CONTROL indicates that the charge transistor 404 and the discharge transistor 408 are permitted to be turned on.

The ESE control circuit 400 is configured to control the flow of current to and from the ESE 402 based on the FET control signal and the comparator output signal provided from the comparator 466. More particularly, in a situation where the charge transistor 404 and the discharge transistor 408 are turned on (e.g., operate in a saturation region), current flows from the power supply of the external circuit 467 through the output node 450, through the discharge transistor 408, to a first node (e.g., a drain) of the charge transistor 404 to the ESE terminal 412 and to the ESE 402. Alternatively, current flows from the ESE 402, through the charge transistor 404 and the discharge transistor 408, to the output node 450 and to a component of the external circuit 467.

In the example of FIG. 4, in response to the FET CONTROL indicating that the discharge transistor 408 is permitted to be turned on, the controller 432 commands the discharge state switch 452 to switch to the second state. In the second state, the control node 453 of the discharge transistor 408 is coupled to the discharge transistor charge pump 464. In situations where the voltage at the ESE terminal 412, VBAT drops below the voltage at the output node 450, VOUT+ by a discharge level, which is set to an amount at least about (e.g., within ±10%) of the voltage at the discharge transistor charge pump 464, VPUMPD, the discharge transistor 408 turns off (e.g., operates in the cut-off region) to prevent further discharge of the ESE 402. Conversely, as long as the voltage at the ESE terminal 412, VBAT remains greater than or equal to the voltage at the output node 450, VOUT+ or the voltage at the ESE terminal 412, VBAT remains below the voltage at the output node 450, VOUT+ by less than the voltage at the discharge transistor charge pump 464, VPUMPD, the discharge transistor 408 is turned on (operates in the saturation region). For purposes of simplification of explanation, unless otherwise noted, it is presumed that the discharge transistor 408 is turned on.

The ESE control circuit 400 is configured such that in situations where the voltage at the ESE terminal 412, VBAT minus the voltage at the output node 450, VOUT+ is less than the threshold voltage, VTHRESH, the comparator 466 de-asserts the comparator output signal (e.g., logical 0) that is provided to the controller 432. Conversely, in situations where the voltage at the ESE terminal, VBAT exceeds the voltage at the output node 450, VOUT+ by a voltage of at least the threshold voltage, VTHRESH, the comparator 466 asserts the comparator output signal (e.g., logical 1).

In situations where the comparator output signal from the comparator 466 is de-asserted (e.g., logical 0), and the FET control signal, FET CONTROL indicates that the charge transistor 404 is to be turned off, the controller 432 de-asserts the boot signal provided to the buffer 435, such that the second node 436 of the boot capacitor 418 is near (e.g., within ±10%) of 0 V or ground. Additionally, the charging state control signal 427 provided from the controller 432 to the charge state switch 421 is configured to cause the charge state switch 421 to remain in the first state. In this situation, the control node 416 and the second node (e.g., a source) of the charge transistor 404 are both coupled to the ESE terminal 412. Accordingly, the charge transistor 404 (e.g., an NMOS) has a gate-to-source voltage, VGS of 0 V, and the charge transistor 404 is turned off. Additionally, in this state, because the first node 434 of the boot capacitor 418 is coupled to the ESE terminal 412 through the control node 416, the boot capacitor 418 is charged to the same voltage level as voltage level of the ESE terminal 412, VBAT over time.

In response to detecting that voltage at the output node 450, VOUT+ drops below the voltage at the ESE terminal 412, VBAT by more than the threshold voltage, VTHRESH, the comparator 466 asserts the comparator output signal. The voltage at the output node 450, VOUT+ may drop, for example, in situations where a component (e.g., a loudspeaker or an amplifier) on the external circuit 467 needs transient power. Alternatively, the voltage at the output node 450, VOUT+ may drop if the power supply of the external circuit 467 is disconnected from an external power source (e.g., a power outlet). In response to assertion of the comparator output signal or in response to the FET control signal, FET CONTROL indicating that the charge transistor 404 is to be turned on, the controller 432 asserts the boot signal provided to the buffer 435. Assertion of the boot signal causes the buffer 435 to output a voltage nearly equal (e.g., within ±10%) to the voltage at the ESE terminal 412, VBAT to the second node 436 of the boot capacitor 418. The voltage of the ESE terminal 412, VBAT at the second node 436 of the boot capacitor 418 operates as an offset voltage that raises voltage at the first node 434 of the boot capacitor 418 to a level that is near (e.g., within ±10%) two times the voltage at the ESE terminal 412 VBAT, namely, 2*VBAT. Accordingly, the first node 434 of the boot capacitor 418 provides a voltage to the control node 416 of the charge transistor 404 that is at least the turn-on level for the charge transistor 404. Because the control node 416 of the charge transistor 404 is coupled to the first node 434 of the boot capacitor 418, the gate-to-source voltage, VGS of the charge transistor 404 (e.g., an NMOS) is raised from 0 V (or ground) to about (e.g., within 2 V) the voltage at the ESE terminal 412, VBAT, thereby turning on the charge transistor 404 (e.g., causing the charge transistor 404 to operate in the saturation region) within 20 μs.

Additionally, at nearly the same time (e.g., within 10 nanoseconds) of asserting the boot signal, in further response to assertion of the comparator output signal by the comparator 466, the controller 432 is also configured to cause the charging state control signal 427 to cause the charge state switch 421 to switch to the second state, which couples the charge transistor charge pump 429 to the control node 416 of the charge transistor 404. However, because the charge transistor 404 is already turned on, a rise time of the charge transistor charge pump 429 does not impact the turn-on time of the charge transistor 404. Rather, the charge transistor charge pump 429 is configured to hold the control node 416 at the voltage level of about 2*VBAT as long as the charge state switch 421 remains in the second state. That is, the inclusion of the boot capacitor 418 avoids the long turn-on time (e.g., greater than 20 μs) of the charge transistor 204 of FIG. 2. Rather, the ESE control circuit 400 is configured to turn on the charge transistor 404 in 20 μs or less such that the voltage at the output node 450, VOUT+ does not drop by more than the threshold voltage, VTHRESH relative to the voltage at the ESE terminal 412, VBAT.

Figure 5:
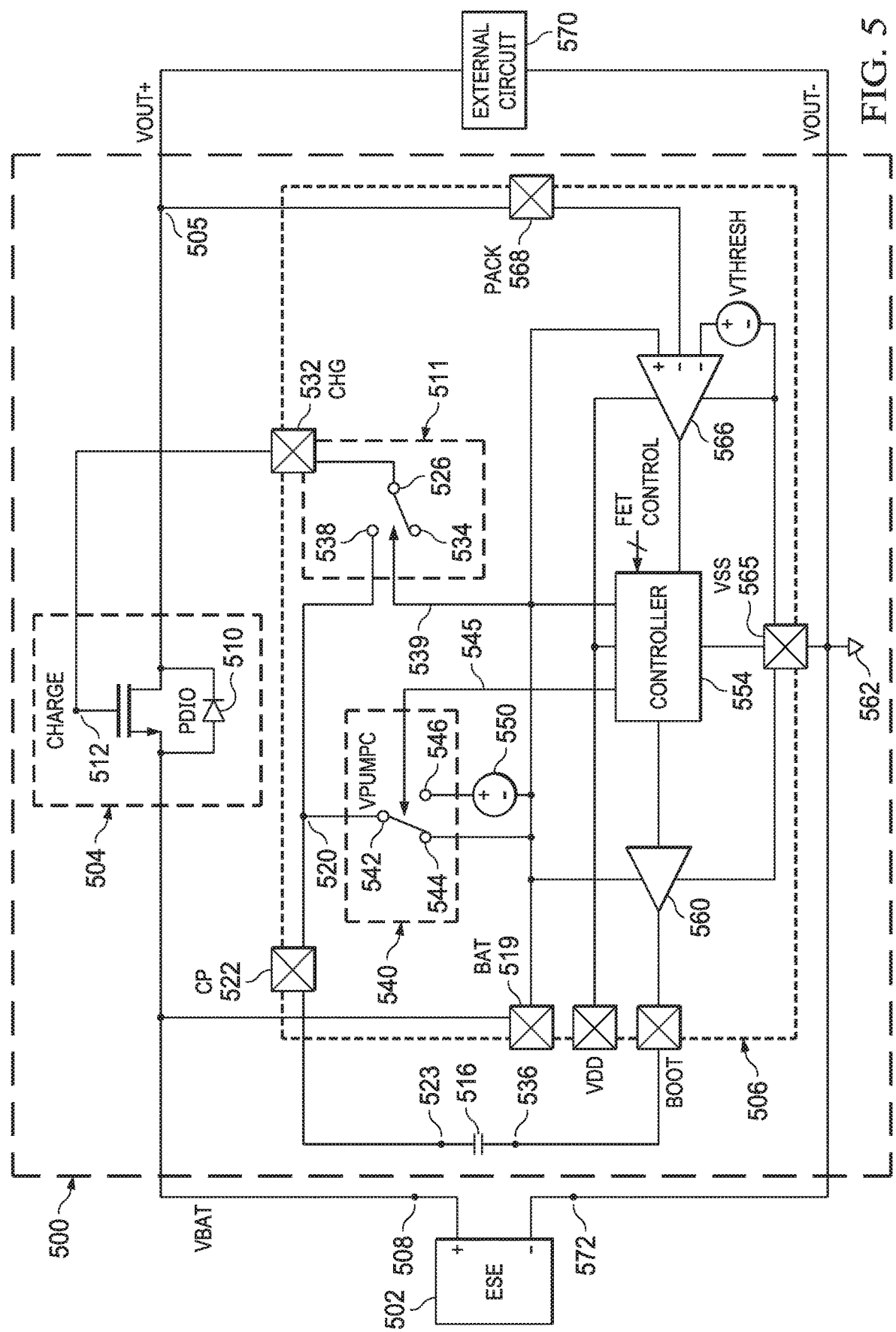
FIG. 5 is a circuit diagram of another example of an ESE control circuit.

FIG. 5 is a circuit diagram of another example ESE control circuit 500 for controlling charging and discharging of an ESE 502 that avoids the aforementioned slow turn-on time of a charge transistor 504, CHARGE. In some examples, the ESE 502 is implemented as a battery. In other examples, the ESE is implemented as a supercapacitor. The ESE control circuit 500 may be used to implement the ESE control circuit 100 of FIG. 1. In some examples, the ESE control circuit 500 is implemented in a battery charger or protector. The ESE control circuit 500 includes a turn-on IC chip 506 that facilitates a fast turn-on time (e.g., 20 μs or less) of the charge transistor 504. By controlling a state (e.g., on or off) of the charge transistor 504, the ESE control circuit 500 controls a flow of current to the ESE 502.

The charge transistor 504 is illustrated and described as being an NMOS. However, in other examples, other types of transistors are employable as the charge transistor 504. The charge transistor 504 includes a first node (e.g., a drain) that is coupled to an output node 505 the ESE control circuit 500. Additionally, the charge transistor 504 includes a second node (e.g., a source) that is coupled to an ESE terminal 508, which ESE terminal 508 is illustrated as the positive ESE terminal of the ESE 502. The charge transistor 504 (implemented as an NMOS) has a body diode 510 that connects the first node (e.g., a drain) node coupled to the ESE terminal 508 and the second node (e.g., a source) of the charge transistor 504. The body diode 510 has a diode drop voltage of PDIO (e.g., 0.3 V to 1.0 V).

Additionally, a first switch 511 is connected between a control node 512 (e.g., a gate) of the charge transistor 504 and the ESE terminal 508. The first switch 511 switchably connects the control node 512 of the charge transistor 504 to the ESE terminal 508 of the ESE 502 through an ESE connection terminal 519, BAT and to a boot capacitor 516 through a charge point terminal 522, CP of the turn-on IC chip 506. As illustrated, the charge point terminal 522, CP is coupled to a first node 523 of the boot capacitor 516. Moreover, the first switch 511 includes a common node 526, a first terminal 534 and a second terminal 538, and the first switch 511 is configured to couple the first terminal 534 or the second terminal 538 with the common node 526 in response to a charge control signal 539. In some examples, the first switch 511 is implemented as a single pole change switch, which can alternatively be referred to as a two state switch. The first terminal 534 of the first switch 511 is coupled to the ESE terminal 508 through an ESE connection terminal 519, BAT and the second terminal 538 of the first switch 511 is coupled to the first node 523 of the boot capacitor 516 through the charge point terminal 522, CPP. The common node 526 is coupled to the control node (e.g., a gate) of the charge transistor 504 through a charge terminal 532, CHG of the turn-on IC chip.

Additionally, a second switch 540 is connected between a control node 512 and the ESE terminal 508. The second switch 540 includes a common node 542, a first terminal 544 and a second terminal 546, and the second switch 540 is configured to couple the first terminal 544 or the second terminal 546 with the common node 542 in response to a charge pump control signal 545. In some examples, the first switch 511 is implemented as a single pole change switch, which can alternatively be referred to as a two state switch. The first terminal 544 of the second switch 540 is coupled to the ESE terminal 412 through the ESE connection terminal 519, BAT and the second terminal 546 of the second switch 540 is coupled to a positive node of a charge pump 550. The charge pump 550 is configured to provide a charge pump voltage, VPUMPC to the ESE voltage at the ESE terminal 508 of the ESE 402, VBAT. In this way, the charge point terminal 522, CP is switchably connected to the ESE terminal 508 and to the charge pump 550.

A negative node of the charge pump 550 is coupled to the ESE terminal 508 of the ESE 502 through the ESE connection terminal 519, BAT. The charge pump 550 operates as a DC-DC converter that includes capacitors to raise a voltage from a voltage at the ESE terminal 508, VBAT to a charge transistor charge pump voltage, VPUMPC for the charge transistor 404 that is selectively applied through the second switch 540 to the control node 512 (e.g., a gate) of the charge transistor 404. In some examples, the charge transistor charge pump voltage, VPUMPC is up to about (e.g., within ±10%) twice of a voltage at the ESE terminal 508, VBAT.

The first switch 511 and the second switch 540 each have a first state and a second state. The first switch 511 is controlled by the charge control signal 539 provided from a controller 554 of the turn-on IC chip 506. Additionally, the second switch 540 is controlled by a charge pump control signal 545 provided from the controller 554. In the first state of the first switch 511, as illustrated, the common node 526 is coupled to the first terminal 534 of the first switch 511. Additionally, in a first state of the second switch 540, the common node 542 is coupled to the first terminal 544 of the second switch 540. Conversely, in a second state of the first switch 511, the common node 526 is coupled to the second terminal 538 of the first switch 511. Additionally, in a second state of the second switch 540, and the common node 542 is coupled to the second terminal 546 of the second switch 540.

Additionally, the controller 554 is configured to provide a boot signal to charge the boot capacitor 516. For example, a buffer 560 is coupled between an output of the controller 554 and a second node 536 of the boot capacitor 516, and the boot signal is provided to an input of the buffer 560. As noted, the first node 523 of the boot capacitor 516 is coupled to the charge point terminal 522, CP. Additionally, a positive voltage rail of the buffer 560 is coupled to the ESE terminal 508 of the ESE 502 and a negative voltage rail of the buffer 560 is coupled to an electrically neutral node 562 (e.g., ground) through a neutral terminal 565, VSS of the turn-on IC chip 506. The controller 554 and the buffer 560 are configured such that in response to assertion of the boot signal (e.g., a logical 1), the output of the buffer 560 at the second node 536 of the boot capacitor 516 is driven to a voltage level about equal (e.g., within ±10%) of the voltage at an ESE terminal 508 of the ESE 502, VBAT according to the positive rail voltage of the buffer 560. Conversely, in situations where the boot signal is de-asserted (e.g., a logical 0), output of the buffer 560 at the second node 536 of the boot capacitor 516 is driven to a voltage of the electrically neutral node 562 (e.g., 0 volts (V) or ground) according to a negative voltage rail of the buffer 560.

The turn-on IC chip 506 also includes a comparator 566. The comparator 566 may include three inputs. For example, the ESE terminal 508 is coupled to a non-inverting input of the comparator 566. Additionally, the output node 505 of the ESE control circuit 500 is coupled to an inverting input of the comparator 566 through a pack terminal 568, PACK of the turn-on IC chip 506. Furthermore, a threshold voltage, VTHRESH is coupled to another inverting input of the comparator 566. As an example, the threshold voltage, VTHRESH is set to a value in a range of 10-50 millivolts (mV). An output of the comparator 566 is coupled to an input of the controller 554, and the comparator provides a comparator output signal to the input of the controller.

The comparator 566 is configured to assert (e.g., a logical 1) the voltage threshold signal in response to the voltage at the ESE terminal 508, VBAT exceeding the voltage at the output node 505, VOUT+ by more than the threshold voltage, VTHRESH (e.g., VBAT−VOUT+≥VTHRESH). Conversely, in situations where the voltage at the ESE terminal 508, VBAT does not exceed the voltage at the output node 505, VOUT+ by more than the threshold voltage, VTHRESH (e.g., VBAT−VOUT+<VTHRESH), the comparator 566 is configured to de-assert (e.g., a logical 0) the comparator output signal.

The output node 505 of the ESE control circuit 500 is coupled to an external circuit 570 that may include a power supply and/or a power sink. The power supply of the external circuit 570 supplies a DC signal to the output node 505 of the ESE control circuit 500. The external circuit 570 is also coupled to the electrically neutral node 562 (e.g., ground), which also provides a negative output voltage, VOUT−. Similarly, a negative terminal 572 of the ESE 502 is coupled to the electrically neutral node 562. In the present example, power flow is bi-directional, such that current flows from the external circuit 570 to the ESE control circuit 500 and to the ESE 502 or from the ESE 502, through the ESE control circuit 500 to the external circuit 570 depending on the state of the ESE 502 and/or the state of the external circuit 570.

Figure 6:
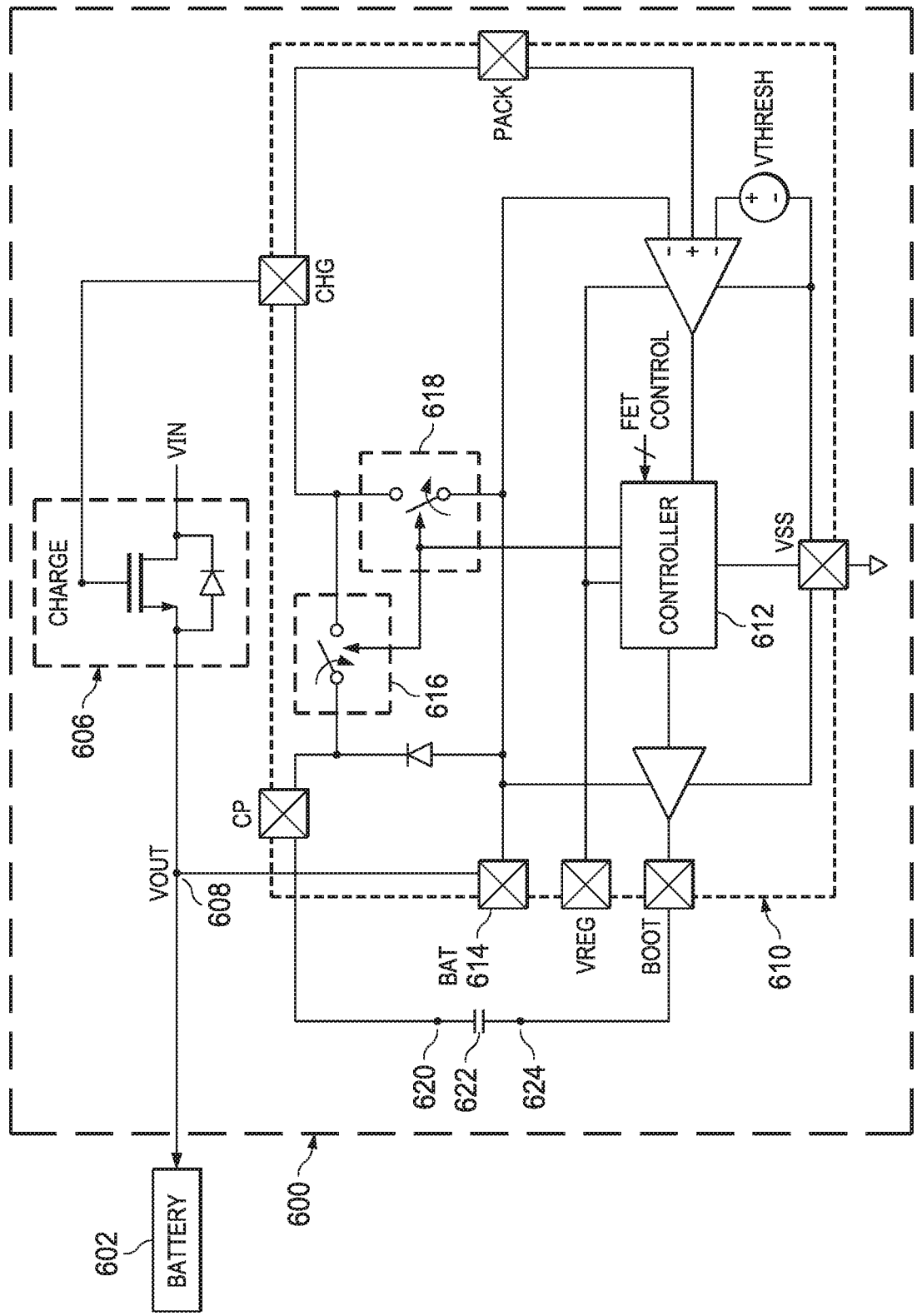
FIG. 6 is a circuit diagram of another example of a battery control circuit.

FIG. 6 illustrates an example of a circuit diagram of a battery control circuit 600 for charging a battery 602 configured to monitor a gate-to-source (VGS) voltage of a charge transistor 606. A source of the charge transistor 606 is coupled to an output node 608 of the battery control circuit 600. The battery control circuit 600 omits a mechanism for comparing a voltage a first node (e.g., a drain) and a second node (e.g., a source) of the charge transistor 606, in contrast to the ESE control circuit 500 of FIG. 5.

The battery control circuit 600 includes a turn-on IC chip 610 with an embedded controller 612. The gate of the charge transistor 606 is switchably connected to a battery terminal 614, BAT of the turn-on IC chip 610, which is also coupled to the output node 608 of the battery control circuit 600 through a first switch 616 and a second switch 618. The gate of the charge transistor 606 is also switchably connected to a first node 620 of a boot capacitor 622. The controller 612 controls a state of the first switch 616 and the second switch 618.

Initially, the voltage at the first node 620 of the boot capacitor 622 is greater than the voltage at the output node 608, VOUT+. In this situation, the controller 612 is configured to cause the first switch 616 and the second switch 618 to connect the gate of the charge transistor 606 to the first node 620 of the boot capacitor 622, and a gate-to-source voltage (VGS) of the charge transistor 606 is above a threshold voltage, VTHRESH, and the charge transistor 606 is turned on (e.g., operating in the linear region). Additionally, the battery control circuit 600 is configured to monitor the gate-to-source voltage, VGS of the charge transistor 606. In situations where the gate-to-source voltage, VGS of the charge transistor 606 drops below the threshold voltage, VTHRESH, (which cause the charge transistor 606 to turn-off) the controller 612 controls the first switch 616 and the second switch 618 to connect the gate of the charge transistor 606 to the battery terminal 614, to keep the charge transistor 606 off (e.g., operating in the cut-off region). Within 10 nanoseconds, the controller 612 asserts a boot signal that indirectly drives a second node 624 of the boot capacitor 622 to a voltage near the voltage at the output node 608, VOUT, thereby driving the voltage at the first node 620 of the boot capacitor 622 to a level greater than that voltage at the output node 608, VOUT, such that a stored electric charge of the boot capacitor 622 is refreshed.

After a configurable amount of time (e.g., 1-3 µs), the controller 612 is configured to cause the first switch 616 and the second switch 618 to connect the gate of the charge transistor 606 to the first node 620 of the boot capacitor 622, such that the gate-to-source voltage, VGS of the charge transistor 606 is above the threshold voltage, VTHRESH and the charge transistor 606 turns on again. Thus, each time the stored electric charge of the boot capacitor 622 is refreshed, the charge transistor 606 is turned off, thereby presenting problems that need addressed.

Referring back to FIG. 5, in some examples, the controller 554 receives a FET control signal, FET CONTROL for setting a state of the ESE control circuit 500. In some examples, the FET control signal, FET CONTROL is provided to an input of the controller 554 from an external source (e.g., another controller). Further, in other examples, the controller 554 includes internal logic for deriving the FET control signal, FET CONTROL. The FET control signal, FET CONTROL provides a command for turning off the charge transistor 504, which correlates to a command for not charging the ESE 502. Alternatively, the FET control signal, FET CONTROL provides a command for the charge transistor 504 to be turned on, which correlates to a command for charging the ESE 502. Additionally, in some examples, the FET control signal, FET CONTROL provides a pump command signal for controlling a state of the charge pump 550.

In a situation where the FET control signal, FET CONTROL indicates that the charge pump 550 is to be turned off, the controller 554 is configured to cause the second switch 540 to remain in the first state. In a situation where the FET control signal, FET CONTROL indicates that the charge pump 550 is to be turned on, the controller 554 is configured to cause the second switch 540 to switch to the second state, thereby coupling the common node 520 to the second terminal 546 and to the charge pump 550. For purposes of simplification of explanation, it is presumed that the FET control signal, FET CONTROL commands the charge pump 550 to be turned on. Additionally, in some examples, a pump control signal separate from the FET control signal may be provided to the controller 554. In a situation where the FET control signal, FET CONTROL indicates that the charge transistor 504 is to be turned off and the comparator output signal provided by the comparator 566 is a logical 0, the controller 554 is configured to cause the first switch 511 to remain in the first state (e.g., common node 526 is coupled to the first terminal 534) and the charge transistor 504 is turned off (e.g., operates in a cut-off region).

The ESE control circuit 500 is configured to control the flow of current to the ESE 502 based on the FET control signal and the comparator output signal of the comparator 566. More particularly, in a situation where the charge transistor 504 is turned on (e.g., operate in a linear region), current flows from the power supply of the external circuit 570 through the output node 505, through the charge transistor 504, to the ESE terminal 508 and to the ESE 502. Alternatively, current flows from the ESE 502, through the charge transistor 504, to the output node 505 and to a component of the external circuit 570.

The ESE control circuit 500 is configured such that in situations where the voltage at the ESE terminal 508, VBAT minus the voltage at the output node 505, VOUT+ is less than the threshold voltage, VTHRESH, the comparator 566 de-asserts the comparator output signal (e.g., logical 0) that is provided to the controller 554. Conversely, in situations where the voltage at the ESE terminal 508, VBAT exceeds the voltage at the output node 505, VOUT+ by voltage of at least the threshold voltage, VTHRESH, the comparator 566 asserts the comparator output signal (e.g., logical 1).

In situations where the comparator output signal from the comparator 566 is de-asserted (e.g., logical 0), and the FET control signal, FET CONTROL, indicates that the charge transistor 504 is to be turned off the controller 554 de-asserts the boot signal provided to the buffer 560, such that the second node 536 of the boot capacitor 516 is near (e.g., within ±10%) of 0 V or ground. Additionally, the charge control signal 539 provided from the controller 554 to the first switch 511 is configured to cause the first switch 511 to remain in the first state. In this situation, the control node 512 and the second node (e.g., a source) of the charge transistor 504 are both coupled to the ESE terminal 508. Accordingly, the charge transistor 504 (e.g., an NMOS) has a gate-to-source voltage, VGS of 0 V, and the charge transistor 504 is turned off (e.g., operating in the cutoff region). Additionally, in this state, because the first node 523 of the boot capacitor 516 is coupled to the ESE terminal 508, the boot capacitor 516 is charged to the same voltage level as voltage level of the ESE terminal 5-9, VBAT over time.

As noted, in situations where the voltage at the output node 505, VOUT+ drops below the voltage at the ESE terminal 508, VBAT by more than the threshold voltage, VTHRESH, the comparator 566 asserts the comparator output signal. The voltage at the output node 505, VOUT+ may drop, for example, in situations where a component (e.g., a loudspeaker or an amplifier) on the external circuit 570 needs transient power. Alternatively, voltage at the output node 505, VOUT+ may drop if the power supply of the external circuit 570 is disconnected from an external power source (e.g., a power outlet). In response to assertion of the comparator output signal or in response to the FET control signal, FET CONTROL indicating that the charge transistor 504 is to be turned on, the controller 554 asserts the boot signal provided to the buffer 560. Assertion of the boot signal causes the buffer 560 to output a voltage nearly equal (e.g., within ±10%) to the voltage at the ESE terminal 508, VBAT to the second node 536 of the boot capacitor 516. Additionally, at nearly the same time (e.g., within 10 nanoseconds) in further response to assertion of the comparator output signal by the comparator 566, the controller 554 is configured to cause the first switch 511 to switch to the second state through control of the charge control signal 539.

Applying the voltage of the ESE terminal 508, VBAT to the second node 536 of the boot capacitor 516 operates as an offset voltage that raises voltage at the first node 523 of the boot capacitor 516 to a level that is near (e.g., within ±10%) two times the voltage at the ESE terminal 508 VBAT, namely, 2*VBAT. Accordingly, the first node 523 of the boot capacitor 516 provides a voltage to the control node 512 (e.g., a gate) of the charge transistor 504 that is at least the turn-on level for the charge transistor 504. Because the first switch 511 is in the second state (e.g., the common node 526 is coupled to the second terminal 538), the control node 512 of the charge transistor 504 is coupled to the first node 523 of the boot capacitor 516. Accordingly, the gate-to-source voltage, VGS of the charge transistor 504 (e.g., an NMOS) is raised from 0 V (or ground) to about (e.g., within ±10%) the voltage at the ESE terminal 508, VBAT, thereby turning on the charge transistor 504 (causing the charge transistor 504 to operate in the linear region) within about 20 μs. Because the second switch 540 is in the second state, the charge pump 550 is configured to ramp up voltage to hold the voltage at the control node 512 of the charge transistor 504 to a level above the voltage at the ESE terminal 508, VBAT, thereby keeping the charge transistor 504 turned on.

In examples where the charge transistor 504 is implemented as an NMOS, each time the first switch 511 is transitioned to the second state thereby coupling the control node 512 of the charge transistor 504 to the first node 523 of the boot capacitor 516, a portion of electric charge stored in the boot capacitor 516 is dissipated. The amount of dissipation is based on a capacitance of the boot capacitor 516 relative to a gate capacitance the charge transistor 504 (e.g., an NMOS). For example, if the gate capacitance of the charge transistor 504 is about 4 nF and the boot capacitor 516 has a capacitance of about 100 nF, the stored electric charge at the boot capacitor 516 dissipates up to about 4% each time the first switch 511 is transitioned to the second state. The offset voltage applied to the second node 536 of the boot capacitor 516 refreshes the stored electric charge of the boot capacitor 516 to compensate for the dissipated electric charge. Refreshing the charge of the boot capacitor 516 avoids dissipating the stored electric charge at the boot capacitor 516 over multiple switching cycles. Furthermore, in contrast the battery control circuit 600 of FIG. 6, there is no need to turn off the charge transistor 504 in order to refresh the stored electric charge of the boot capacitor 516.

Figure 7:
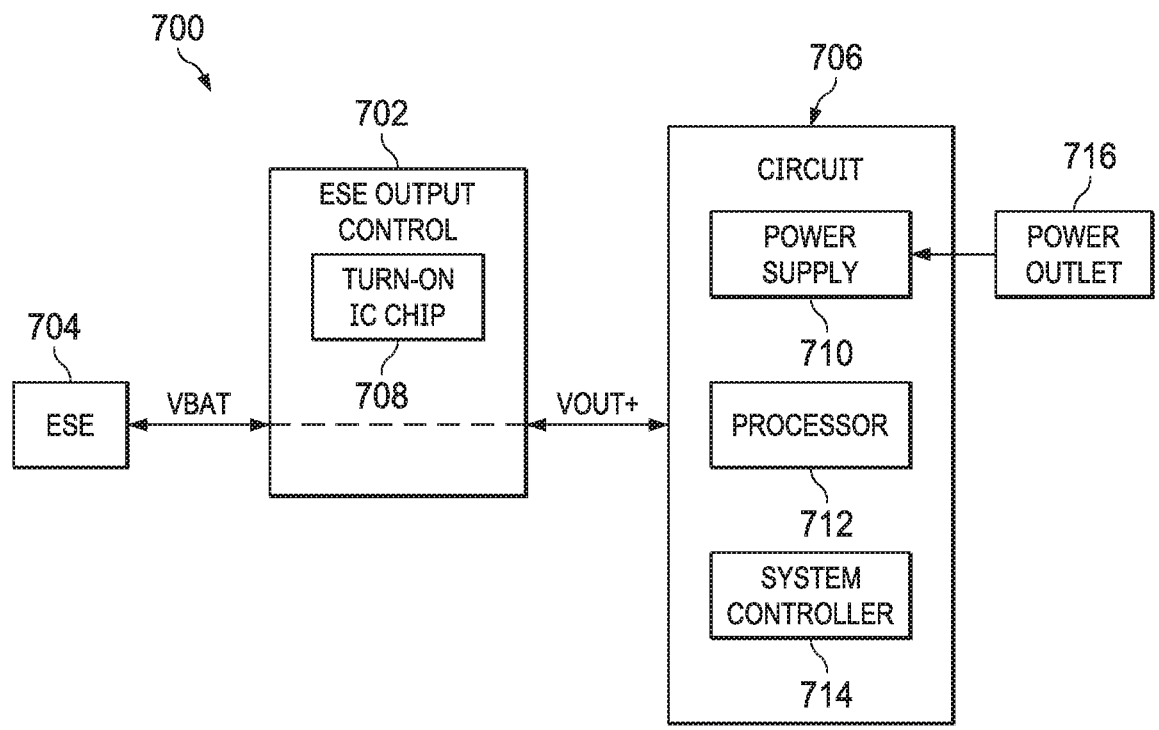
FIG. 7 is a block diagram of an example system for charging and discharging an ESE.

FIG. 7 illustrates a block diagram of a system 700, such as an ESE system, for charging an ESE that avoids a slow turn-on time of a charge transistor. In some examples, the system 700 is implemented on a mobile computing device, such as a smart phone, a laptop or a tablet computer. The system 700 includes an ESE control circuit 702 (e.g., the ESE control circuit 100 of FIG. 1, the ESE control circuit 400 of FIG. 4 and/or the ESE control circuit 500 of FIG. 5) coupled between a terminal of an ESE 704 (e.g., the ESE 102 of FIG. 1, the ESE 402 of FIG. 2 and/or the ESE 502 of FIG. 5) and a circuit 706 (e.g., the external circuit 140 of FIG. 1, the external circuit 467 of FIG. 4 and/or the external circuit 570 of FIG. 5). In some examples, the ESE 704 is a battery, such as a single cell or multi-cell rechargeable battery. In other examples, the ESE 704 is a supercapacitor.

The ESE control circuit 702 includes a turn-on IC chip 708 configured to facilitate a fast turn-on (e.g., within 20 μs) of the charge transistor. In some examples, the ESE control circuit 702 also includes a discharge transistor. The turn-on IC chip 708 controls a state of the discharge transistor. The circuit 706 includes a power supply 710 configured to provide power to a processor 712 and a system controller 714. The system controller 714 is configured to provide a FET control signal to the ESE control circuit 702. The turn-on IC chip 708 controls the charge transistor at least in part based on the state of the FET control signal.

The power supply 710 is connectable to a power outlet 716. In some examples, the power outlet 716 is implemented as an alternating current (AC) source or a DC source. The power supply 710 is configured to regulate power from the ESE 704 provided by the ESE control circuit 702 and/or the power outlet 716 that is supplied to the system controller 714 and the processor 712.

In operation, the turn-on IC chip 708 turns off the discharge transistor to prevent the flow of current from the ESE 704 to the circuit in a voltage at the ESE terminal, VBAT drops below a threshold level. Additionally, the ESE control circuit 702 is configured to monitor an ESE voltage, VBAT (e.g., an input voltage) and an output voltage, VOUT+ of the ESE control circuit 702. In situations where the output voltage, VOUT+ is equal to or greater than the ESE voltage, VBAT or in situations where the output voltage, VOUT+ is less than the ESE voltage, VBAT, but the difference between the output voltage, VOUT+ and the ESE voltage, VBAT is less than a threshold voltage, the turn-on IC chip 708 turns the charge transistor off, thereby preventing additional current from flowing to the ESE 704. Such situations may occur, for instance, if the power supply 710 is electrically coupled to the power outlet 716.

Additionally, in situations where the ESE voltage, VBAT exceeds the voltage at the output node 108, VOUT+ by voltage greater than or equal to the threshold voltage, the turn-on IC chip 708 applies a voltage to a node of a boot capacitor coupled to the control node of the charge transistor, thereby quickly (e.g., within 20 μs) turning on the charge transistor, and allowing current to flow from the ESE 704 to the circuit 706. These situations can occur for a plurality of reasons. For example, the output voltage, VOUT+ may drop below the ESE voltage, VBAT by at least the threshold voltage if the power supply 710 is unplugged from the power outlet 716. Alternatively, in situations where the system 700 is implemented on a mobile computing device, the output voltage, VOUT+ may drop below the ESE voltage, VBAT by at least the threshold voltage even in situations where the power supply 710 remains plugged into the power outlet if a particular application (e.g., a music player) requires a relatively large amount of transient power (e.g., to drive a loudspeaker or an amplifier). By employing the system 700, slow turn-on times (e.g., greater than 20 μs) of the charge transistor are prevented such that sags in the output voltage, VOUT+ are avoided.

Figure 8:
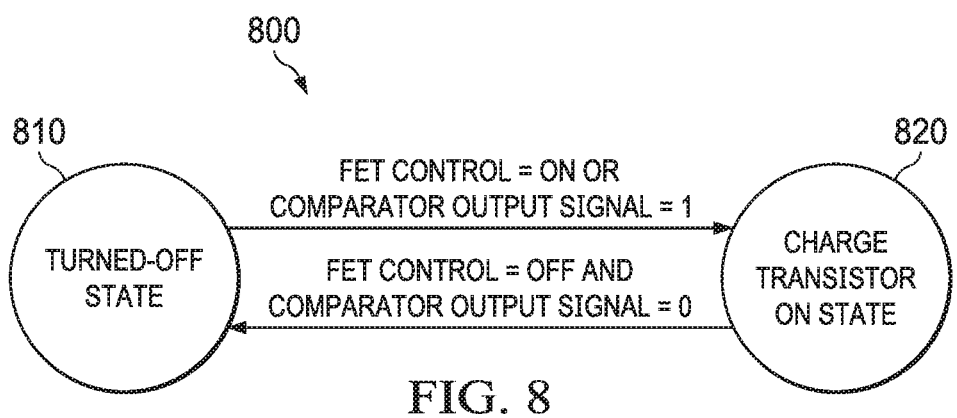
FIG. 8 is a state diagram of a turn-on IC chip for an ESE control circuit.

FIG. 8 illustrates a state diagram of a turn-on IC chip for an ESE control circuit 800 that can be implemented by the turn-on IC chip 106 of FIG. 1, the turn-on IC chip 406 of FIG. 4 and/or the turn-on IC chip 506 of FIG. 5. The turn-on IC chip includes a controller, such as the controller 132 of FIG. 1, the controller 432 of FIG. 4 and/or the controller 554 of FIG. 5. The turn-on IC chip is employable in an ESE control circuit, such as the ESE control circuit 100 of FIG. 1, the ESE control circuit 400 of FIG. 4, the ESE control circuit 500 of FIG. 5 and/or the ESE control circuit 702 of FIG. 7.

The turn-on IC chip is initially in a turned-off state 810. In the turned-off state 810, a FET control signal provided from an external system (e.g., the system controller 714 of FIG. 7) indicates that a charge transistor of the ESE control circuit provided to the turn-on IC chip is to be turned off and a comparator output signal from a comparator (e.g., the comparator 136 of FIG. 1, the comparator 466 of FIG. 2 and/or the comparator 566 of FIG. 5) provided to the controller of the turn-on IC chip is a logical 0. Accordingly, in response to the FET control signal and the logical 0 comparator output signal, the controller is configured to provide a control signal to a switch of the turn-on IC chip (e.g., the switch 120 of FIG. 1, the charge state switch 421 of FIG. 4 and/or the first switch 511 of FIG. 5) causing the switch to couple a control node (e.g., a gate) of the charge transistor to an ESE terminal, such that the charging transistor is turned off (e.g., operates in a cut-off region).

The controller of the turn-on IC chip 406 is configured to keep the charge transistor turned off (e.g., operating in the cut-off region) or to turn the charge transistor off if the comparator output signal is a logical 0 and the FET control signal indicates that the charge transistor is to be turned off. To turn the charge transistor off (if needed), the turn-on IC chip couples the control node (e.g., a gate) of the charge transistor to the ESE terminal. As one example, the turn-on IC chip remains in the turned-off state if the ESE is fully charged, thereby preventing over-charging of the ESE.

Additionally, in response to the comparator output being a logical 1 or the FET control signal indicating that the charge transistor is to be turned on (labeled in FIG. 8 as FET CONTROL=ON OR COMPARATOR OUTPUT SIGNAL=1), the turn-on IC chip transitions to a charge transistor on state 820. As an example, the turn-on IC chip may transition to the charge transistor on state 820 in situations where external power is removed from an external circuit (e.g., the external circuit 140 of FIG. 1, the external circuit 467 of FIG. 4 and/or the external circuit 570 of FIG. 1 coupled to the ESE control circuit). In other examples, the turn-on IC chip may transition to the charge transistor on state 820 in situations where a component (e.g., a loudspeaker or amplifier) operating on the external circuit needs a transient burst of power.

In the charge transistor on state 80, the turn-on IC chip is configured to quickly (e.g., 20 µs or less) turn-on the charge transistor. To facilitate the quick turn-on of the charge transistor, the turn-on IC chip applies a voltage to a first node of a boot capacitor (e.g., the boot capacitor 114 of FIG. 1, the boot capacitor 418 of FIG. 4 and/or the boot capacitor 516 of FIG. 5) that is nearly equal (e.g., within ±10%) to the voltage at the ESE terminal. Additionally, the controller is configured to control the switch to cause the booth capacitor to apply a voltage of about (e.g., within ±10%) twice the voltage at the ESE terminal to the control node (e.g., the gate) of the charge transistor, such that the charge transistor turns on (e.g., operates in the linear region). In response to the comparator output signal being a logical 0 and the FET control signal indicating that the charge transistor is to be turned off (labeled in FIG. 8 as FET CONTROL=OFF AND COMPARATOR OUTPUT SIGNAL=0), the turn-on IC chip transitions to the turned-off state 810.

Figure 9:
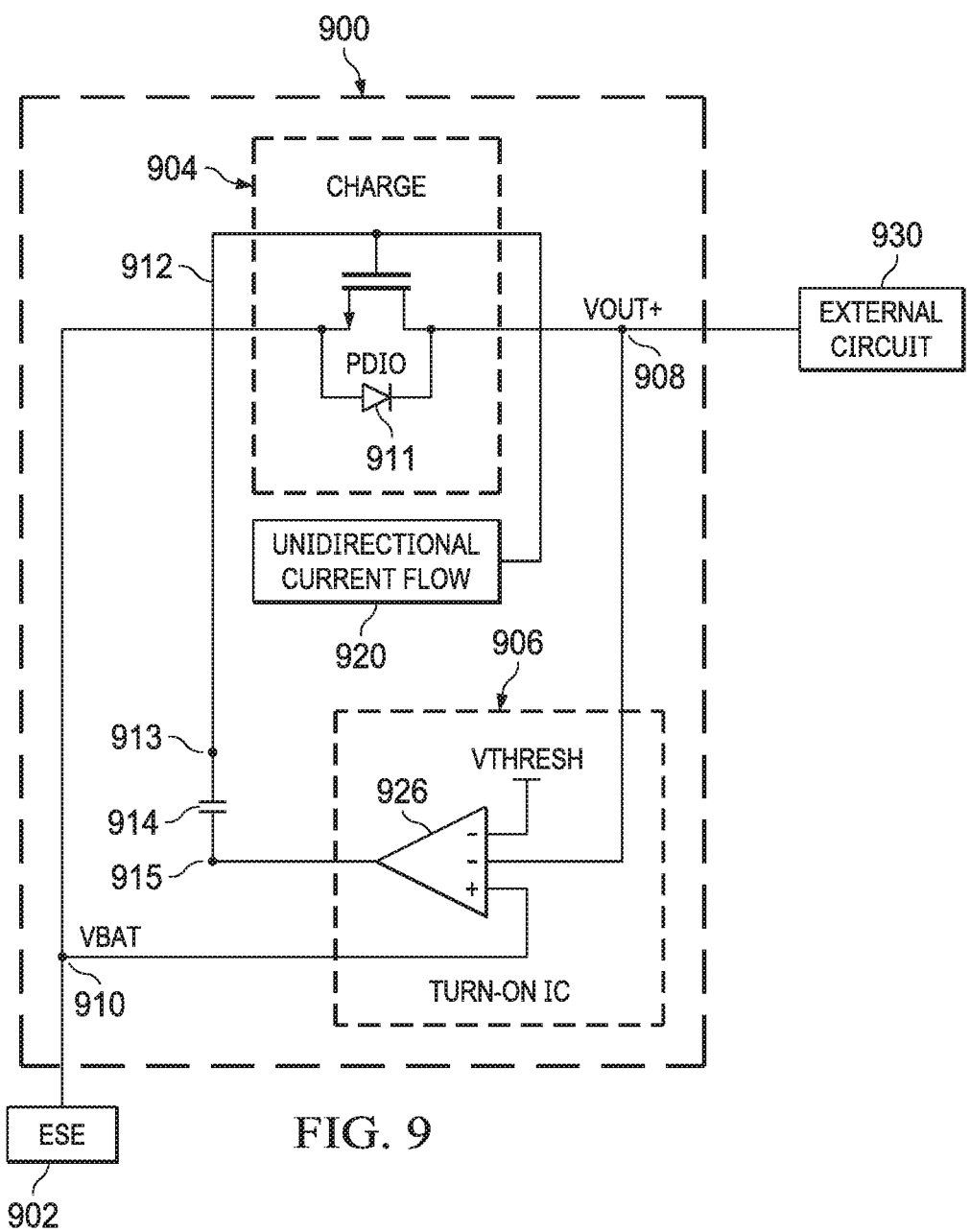
FIG. 9 is a diagram of an example of an ESE control circuit.

FIG. 9 is a block diagram of an ESE control circuit 900 configured to charge an ESE 902 that avoids the aforementioned slow turn-on time (e.g., greater than 20 µs) of a charge transistor 904. In some examples, the ESE 902 is implemented as a battery. In other examples, the ESE 902 is implemented as a supercapacitor. In some examples, the ESE control circuit 900 is implemented in a battery charger or protector, including a device that employs a rechargeable single cell or multi-cell battery pack. The ESE control circuit 900 includes a turn-on IC chip that facilitates a fast turn-on time (e.g., within 20 µs) of the charge transistor 904. The charge transistor 904 is illustrated and described as being an NMOS field effect transistor.

The ESE control circuit 900 represents a low-cost ESE control circuit 900 that omits certain components, such as a controller (e.g., the controller 132 of FIG. 1, the controller 432 of FIG. 4 or the controller 554 of FIG. 5) and a buffer (e.g., the buffer 134 of FIG. 1, the buffer 435 of FIG. 4 or the buffer 560 of FIG. 5). The charge transistor 904 includes a first node (e.g., a drain) that is coupled to an output node 908 of the ESE control circuit 900. Additionally, the charge transistor 904 includes a second node (e.g., a source) that is coupled to an ESE terminal 910 (e.g., a positive terminal of the ESE 902, or VBAT where the ESE 902 includes a battery cell). The charge transistor 904 (implemented as an NMOS) has a body diode 911 that connects the first node and the second node of the charge transistor. The body diode has a voltage drop of 0.3 volts (V) to 1.0 V.

A control node 912 (e.g., a gate) of the charge transistor 904 is coupled to a first node 913 of a boot capacitor 914. The boot capacitor 914 has a second node 915 coupled to an output of the turn-on IC chip 906. In some examples where the charge transistor 904 is implemented as an NMOS, the boot capacitor 914 has a capacitance of at least one order of magnitude greater than a gate capacitance of the charge transistor 904. As one example, if the gate capacitance of the charge transistor is 4 nF, the boot capacitor 914 may be selected to have a capacitance of 100 nF. Additionally, a unidirectional current flow element 920 is connected between the control node 912 and the ESE terminal 910. In some examples, the unidirectional current flow element 920 is implemented as a diode. In other examples, the unidirectional current flow element 920 is implemented with a charge pump (e.g., the charge pump 116 of FIG. 1, the charge transistor charge pump 429 of FIG. 4 or the charge pump 550 of FIG. 5) coupled to a switch (e.g., the switch 120 of FIG. 1, the charge state switch 421 of FIG. 4 or the first switch 511 and the second switch 540 of FIG. 1) controlled by a controller (e.g., the controller 132 of FIG. 1, the controller 432 of FIG. 4 or the controller 554 of FIG. 5).

The turn-on IC chip 906 includes a comparator 926. In this example, the comparator 926 includes three inputs. More particularly, the ESE terminal 910 is coupled to a non-inverting input of the comparator 926. Additionally, the output node 908 of the ESE control circuit 900 is coupled to a first inverting input of the comparator 926. Furthermore, a threshold voltage, VTHRESH is coupled to a second inverting input of the comparator 926. As an example, the threshold voltage, VTHRESH is set to a value in a range of 10-50 mV. An output of the comparator 926 is implemented as a boot signal, such that the output of the comparator 926 (e.g., an output of the turn-on IC chip 906) is provided to the second node 915 of the boot capacitor 914.

The comparator 926 of the turn-on IC chip 906 is configured such that assertion of the boot signal (e.g., a logical 1) is configured to cause the second node 915 of the boot capacitor 914 to drive to a voltage level about equal (e.g., within ±10%) of the voltage at the ESE terminal 910, VBAT. Conversely, in situations where the boot signal is de-asserted (e.g., a logical 0), the second node 915 of the boot capacitor 914 is driven to a voltage of the electrically neutral node (e.g., 0 volts (V) or ground).

The comparator 926 is configured to assert (e.g., a logical 1) the voltage threshold signal in response to the voltage at the ESE terminal 910, VBAT exceeding the voltage at the output node 908, VOUT+ by more than the threshold voltage, VTHRESH. Conversely, in response to the comparator detecting that the voltage at the ESE terminal 910, VBAT does not exceed the voltage at the output node 908, VOUT+ by more than the threshold voltage, VTHRESH, the comparator 926 is configured to de-assert (e.g., a logical 0) the boot signal.

The output node 908 of the ESE control circuit 900 is coupled to an external circuit 930. In some examples, the external circuit 930 is implemented with external systems, such as a computing device (e.g., a mobile computing device) that are powered by the ESE 902. The external circuit 930 may include a power supply configured to provide a DC signal at the output node 908 of the ESE control circuit 900 and/or a power sink. Additionally, in some situations, the ESE 902 provides a DC signal to the external circuit 930. Accordingly, in the present example, power flow is bi-directional, such that current flows from the external circuit 930 to the ESE control circuit 900 and to the ESE 902 or from the ESE 902, through the ESE control circuit 900 to the external circuit 930 depending on the state of the ESE 902 and/or the state of the external circuit 930. More particularly, in a situation where the charge transistor 904 is turned on (e.g., operates in a linear region), current flows from the power supply of the external circuit 930 through the output node 908, through the charge transistor 904, to the ESE terminal 910 and to the ESE 902. Alternatively, current flows from the ESE 902, through the charge transistor 904, to the output node 908 and to a component of the external circuit 930.

The ESE control circuit 900 is configured such that in situations where the voltage at the ESE terminal 910, VBAT minus the voltage at the output node 908, VOUT+ is less than the threshold voltage, VTHRESH (e.g., VBAT−VOUT+<THRESH), the comparator 926 de-asserts the boot signal (e.g., logical 0) that is provided to the second node 915 of the boot capacitor 914. Conversely, in situations where the voltage at the ESE terminal 910, VBAT exceeds the voltage at the output node 908, VOUT+ by voltage greater than or equal to the threshold voltage, VTHRESH (e.g., VBAT−VOUT+≥THRESH), the comparator 926 asserts the boot signal (e.g., logical 1).

In situations where the boot signal from the comparator 926 is de-asserted (e.g., logical 0), the second node 915 of the boot capacitor 914 is near (e.g., within ±10%) of 0 V. Additionally, the unidirectional current flow element 920 allows current from the ESE terminal 910 to flow, such that a voltage near (e.g., within ±10%) the voltage at the ESE terminal 910, VBAT is provided to the control node 912 of the charge transistor 904. In this situation, the control node 912 and the second node (e.g., the source) of the charge transistor 904 both have a voltage nearly equal (within ±10%) to the voltage at the ESE terminal 910, VBAT. Accordingly, the charge transistor 904 (e.g., an NMOS) has a gate-to-source voltage, VGS of 0 V, and the charge transistor 904 is turned off. Additionally, in this state, because the first node 913 of the boot capacitor 914 is coupled to the ESE terminal 910 through the control node 912, the boot capacitor 914 is charged to nearly the same voltage level (e.g., within ±10%) as voltage level of the ESE terminal 910, VBAT over time.

As noted, in response to detecting that the voltage at the output node 908, VOUT+ drops below the voltage at the ESE terminal 910, VBAT by at least the threshold voltage, VTHRESH, the comparator 926 asserts the boot signal (e.g., logical 1). The voltage at the output node 908, VOUT+ may drop, for example, in situations where a component (e.g., a loudspeaker or an amplifier) on the external circuit 930 needs transient power. Alternatively, voltage at the output node 908, VOUT+ may drop if the power supply of the external circuit 930 is disconnected from an external power source (e.g., a power outlet). Assertion of the boot signal is configured to apply a voltage nearly equal (e.g., within ±10%) to the voltage at the ESE terminal 910, VBAT to the voltage at the second node 915 of the boot capacitor 914. Applying the voltage of the ESE terminal 910, VBAT to the second node 915 of the boot capacitor 914 to the voltage operates as an offset voltage that raises voltage at the first node 913 of the boot capacitor 914 to a level that is near (e.g., within ±10%) two times the voltage at the ESE terminal 910 VBAT, namely, 2*VBAT. Accordingly, the first node 913 of the boot capacitor 914 provides a voltage to the control node 912 of the charge transistor 904 that is at least the turn-on level for the charge transistor 904, CHG FET VON. In situations where the charge transistor 904 is an NMOS, because the control node 912 is coupled to the first node 913 of the boot capacitor 914, the gate-to-source voltage, VGS of the charge transistor 904 is raised from 0 V to about (e.g., within ±10%) the voltage at the ESE terminal 910, VBAT, thereby turning on the charge transistor 904 (causing the charge transistor 904 to operate in the linear region) relatively quickly (e.g., within 20 μs).

Modifications are possible in the described embodiments, and other embodiments are possible, within the scope of the claims.

What is claimed is:

1. An energy storage element control circuit comprising:
    a charge transistor having a first node adapted to be coupled to an output node of the energy storage element control circuit and a second node adapted to be coupled to a terminal of an energy storage element;
    a boot capacitor having a first node and a second node;
    a comparator including:
        a first input node coupled to the first node of the charge transistor;
        a second input node adapted to be coupled to the terminal of the energy storage element; and
        an output node;
    a controller having a boot output node coupled to the first node of the boot capacitor, the controller being coupled between the output node of the comparator and the boot capacitor; and
    a buffer coupled between the controller and the first node of the boot capacitor, and a positive voltage rail of the buffer is adapted to be coupled to the terminal of the energy storage element.

2. The energy storage element control circuit of claim 1, in which the controller is configured to assert a boot signal at the boot output node in response to assertion of a comparator output signal from the comparator indicating that a voltage of the energy storage element exceeds a voltage at the output node of the energy storage element control circuit by at least a threshold voltage level.

3. The energy storage element control circuit of claim 2, in which the second node of the boot capacitor is coupled to a control node of the charge transistor, the buffer is configured to apply a voltage to the first node of the boot capacitor that drives the control node of the charge transistor to a turn-on level that is greater than a voltage of the terminal of the energy storage element in response to the boot signal.

4. The energy storage element control circuit of claim 1 including a charge pump, the charge pump comprising:
    a first node coupled to a first terminal of a charge state switch, and a common node of the charge state switch is coupled to a control node of the charge transistor; and
    a second node of the charge pump adapted to be coupled to the terminal of the energy storage element, and a charge state control signal output by the controller is configured to control a state of the charge state switch based at least in part on a voltage at the output node of the comparator.

5. The energy storage element control circuit of claim 4, including:
a discharge transistor including:
a first node coupled to the first node of the charge transistor;
a second node coupled to the output node of the energy storage element control circuit; and
a control node coupled to a common node of a discharge state switch.

6. The energy storage element control circuit of claim 1, in which the second node of the boot capacitor is coupled to a charge point terminal of a turn-on IC, the turn-on IC including:
a switch including:
a common node coupled to a control node of the charge transistor;
a first terminal coupled to the charge point terminal of the turn-on IC; and
a second terminal adapted to be coupled to the terminal of the energy storage element, and the controller is configured to provide a charge control signal to control a state of the switch based at least in part on a voltage at the output of the comparator.

7. The energy storage element control circuit of claim 6, in which the switch is a first switch, the turn-on IC including:
a second switch including:
a common node coupled to the charge point terminal of the turn-on IC;
a first terminal coupled to a node of a charge pump; and
a second terminal coupled to the energy storage element connection terminal of the turn-on IC, and the controller is configured to provide a charge pump control signal to control a state of the second switch based on a control signal.

8. The energy storage element control circuit of claim 1, in which the charge transistor is an N-channel metal oxide semiconductor field effect transistor (NMOS), and the NMOS has a body diode coupled between the first node and the second node of the NMOS.

9. The energy storage element control circuit of claim 8, the boot capacitor having a capacitance that is at least one order of magnitude greater than a gate capacitance of the NMOS.

10. An energy storage element control circuit comprising:
a charge transistor configured to control a flow of current to an energy storage element terminal based on a voltage difference between an energy storage element voltage at the energy storage element terminal, which is adapted to be coupled to a first node of the charge transistor, and a control node of the charge transistor;
a turn-on integrated circuit (IC) comprising:
a comparator configured to output a comparator output signal in response to the energy storage element voltage at the energy storage element terminal exceeding a voltage at an output node of the energy storage element control circuit by at least a threshold voltage level, and the turn-on IC chip being configured to assert a boot signal based at least in part on the comparator output signal, and the boot signal is to apply a voltage to a boot capacitor that drives the control node of the charge transistor to a turn-on level that is greater than the energy storage element voltage.

11. The energy storage element control circuit of claim 10, the turn-on IC including a controller coupled between the comparator and the boot capacitor, wherein the controller is configured to output the boot signal based at least in part on the comparator output signal.

12. The energy storage element control circuit of claim 11, the turn-on IC including a charge pump configured to apply a charge pump voltage to maintain the turn-on level of the control node of the charge transistor.

13. The energy storage element control circuit of claim 12, the turn-on IC including a charge state switch coupled between the charge pump and the control node of the charge transistor, in which the controller is configured to control a state of the charge state switch, and the charge state switch is configured in a first state to couple the charge pump to the control node of the charge transistor and is configured in a second state to couple the energy storage element terminal to the control node of the charge transistor.

14. The energy storage element control circuit of claim 13, including a discharge transistor, the discharge transistor configured to prevent a flow of current from the energy storage element terminal in response to the voltage at the energy storage element terminal dropping below a discharge level.

15. The energy storage element control circuit of claim 11, including a buffer coupled between the boot capacitor and the controller, and the buffer is configured to refresh a stored electric charge in the boot capacitor each time the boot signal is asserted by the controller.

16. An energy storage element system comprising:
an energy storage element;
an energy storage element control circuit adapted to be coupled between a terminal of the energy storage element and an output node of the energy storage element control circuit, the energy storage element control circuit including:
a charge transistor configured to control a flow of current to the terminal of the energy storage element based on a voltage difference between a voltage at the terminal of the energy storage element and the output node of the energy storage element control circuit;
a boot capacitor; and
a turn-on integrated circuit (IC) configured to provide a voltage to the boot capacitor to raise a voltage at a control node of the charge transistor in response to the voltage at the terminal of the energy storage element exceeding a voltage at the output node of the energy storage element control circuit by at least a threshold voltage level, such that the control node of the charge transistor increases to a turn-on level that is greater than the voltage of the terminal of the energy storage element; and
a circuit including:
a power supply adapted to be coupled to the output node of the energy storage element control circuit; and
a processor that is powered by the power supply and the energy storage element.

17. The energy storage element system of claim 16, the turn-on IC being configured to provide a voltage level of an electrically neutral node to the boot capacitor to lower a voltage at the control node of the charge transistor in response to the voltage at the terminal of the energy storage element minus the voltage at the output node of the energy storage element control circuit being less than a threshold voltage level, such that the control node of the charge transistor decreases below the turn-on level to prevent current flow to the energy storage element.

18. The energy storage element system of claim 16, the circuit including a system controller configured to provide a control signal to the turn-on IC, in which the IC is configured to provide the voltage to the boot capacitor to raise the voltage at the control node of the charge transistor in response to a command in the control signal.

* * * * *